US011605980B2

(12) United States Patent
Yu et al.

(10) Patent No.: US 11,605,980 B2
(45) Date of Patent: Mar. 14, 2023

(54) MULTI-TRANSMITTING MULTI-RECEIVING MAGNETIC-RESONANCE WIRELESS CHARGING SYSTEM FOR MEDIUM-POWER ELECTRONIC APPARATUS

(71) Applicant: Chengdu Sprouting Technology Co., Ltd., Chengdu (CN)

(72) Inventors: Yiqiang Yu, Chengdu (CN); Wei Li, Chengdu (CN)

(73) Assignee: CHENGDU SPROUTING TECHNOLOGY CO., LTD., Chengdu (CN)

( * ) Notice: Subject to any disclaimer, the term of this patent is extended or adjusted under 35 U.S.C. 154(b) by 335 days.

(21) Appl. No.: 17/030,405

(22) Filed: Sep. 24, 2020

(65) Prior Publication Data

US 2021/0336483 A1 Oct. 28, 2021

(30) Foreign Application Priority Data

Apr. 23, 2020 (CN) ......................... 202010324499.7

(51) Int. Cl.
*H02J 50/12* (2016.01)
*H02J 50/40* (2016.01)
(Continued)

(52) U.S. Cl.
CPC ................ *H02J 50/12* (2016.02); *H02J 7/02* (2013.01); *H02J 50/40* (2016.02); *H02M 3/155* (2013.01);
(Continued)

(58) Field of Classification Search
CPC .... H02J 50/12; H02J 7/02; H02J 50/40; H02J 50/402; H02J 50/80; H02J 50/20;
(Continued)

(56) References Cited

U.S. PATENT DOCUMENTS

| | | | | |
|---|---|---|---|---|
| 11,121,589 B2 * | 9/2021 | Yu | ........................... | H02J 50/80 |
| 2016/0087687 A1 * | 3/2016 | Kesler | ..................... | H02J 50/80<br>307/104 |
| 2022/0108262 A1 * | 4/2022 | Cella | ................ | G05B 19/41885 |

* cited by examiner

*Primary Examiner* — Stacy Whitmore
(74) *Attorney, Agent, or Firm* — Bayramoglu Law Offices LLC

(57) ABSTRACT

A multi-transmitting multi-receiving magnetic-resonance wireless charging system for a medium-power electronic apparatus includes a magnetic-resonance transmitting module and a magnetic-resonance receiving module. The magnetic-resonance transmitting module includes a transmitting-end Bluetooth-communication and control module and at least two magnetic-resonance transmitting channels. Each magnetic-resonance transmitting channel includes a direct current/direct current (DC/DC) regulator module, a radio-frequency power amplifier source, a matching network and a magnetic-resonance transmitting antenna which are connected sequentially. The magnetic-resonance receiving module includes a receiving-end Bluetooth-communication and control module, a power synthesis and protocol module and at least two magnetic-resonance receiving channels. Each magnetic-resonance receiving channel includes a magnetic-resonance receiving antenna, a receiving-antenna matching network, a rectifier and filter module, a primary regulator and filter module and a secondary regulator and filter module which are connected sequentially. The magnetic-resonance transmitting antenna is coupled with the magnetic-resonance receiving antenna in one-to-one correspondence.

10 Claims, 16 Drawing Sheets

(51) Int. Cl.

| | |
|---|---|
| ***H02J 7/02*** | (2016.01) |
| ***H02M 3/155*** | (2006.01) |
| ***H03F 3/24*** | (2006.01) |
| ***H04B 5/00*** | (2006.01) |
| *H01P 3/08* | (2006.01) |

(52) U.S. Cl.
CPC ........... *H03F 3/245* (2013.01); *H04B 5/0037* (2013.01); *H04B 5/0081* (2013.01); *H01P 3/081* (2013.01); *H03F 2200/451* (2013.01); *H04B 2201/71346* (2013.01)

(58) Field of Classification Search
CPC ......... H02J 50/70; H02M 3/155; H03F 3/245; H03F 2200/451; H03F 1/52; H04B 5/0037; H04B 5/0081; H04B 2201/71346; H01P 3/081
See application file for complete search history.

MULTI-TRANSMITTING MULTI-RECEIVING MAGNETIC-RESONANCE WIRELESS CHARGING SYSTEM FOR MEDIUM-POWER ELECTRONIC APPARATUS

CROSS REFERENCE TO THE RELATED APPLICATIONS

This application is based upon and claims priority to Chinese Patent Application No. 202010324499.7, filed on Apr. 23, 2020, the entire contents of which are incorporated herein by reference.

TECHNICAL FIELD

The present invention relates to wireless power transmission, and more particularly relates to a multi-transmitting multi-receiving magnetic-resonance wireless charging system for a medium-power electronic apparatus.

BACKGROUND

Traditional household appliances and electronic apparatus with built-in batteries are powered through a wired connection between a power line and a power socket. Electric utility lines and wires for supplying power to these electronic apparatus are ubiquitous. Such lines and wires not only occupy an activity space and limit the convenient use of the devices and apparatus, but also present safety hazards, some of which are hidden. Now, household appliances, consumer electronic products and mobile communication apparatus have been modernized with the evolution of electronic information and automation control technologies. Thus, with increased demand for a wireless-based portable device and a green energy grid system, research and application of a wireless energy transmission technology have rapidly become an area of focus in academic and industrial circles in China and throughout the world.

Currently, wireless charging technologies are mainly classified into three types. The first type is in compliance with the quality index (QI) standard mainly popularized by the Wireless Power Consortium (WPC). It is also referred to as a magnetic induction coupling technology. The second type uses a magnetic resonance coupling technology made popular by the Airfuel alliance. The third type uses an electromagnetic radiation-type wireless energy transmission technology. Compared with the magnetic induction technology, the magnetic resonance coupling technology has obvious advantages in charging distance, degrees of spatial freedom, one-to-many charging manner and power expansion. Meanwhile, the magnetic resonance coupling technology has a greater value when it comes to energy conversion efficiency, transmission power and electromagnetic safety than the electromagnetic radiation-type wireless energy transmission technology. The magnetic resonance coupling technology has found recent application in an intelligent wear device, a floor mopping robot, an automatic guided vehicle (AGV) and other apparatus. In these applications, the device includes a wireless charging function and so, the aforementioned concerns of safety and user experience enhancement are improved. Moreover, magnetic resonance coupling technology in the field of smart homes is changing the manner in which traditional household appliances, mobile communication devices and consumer electronics are used. Using a residential building structure as an exemplary platform, all the power lines in a domestic living area can be completely removed by using magnetic resonance wireless charging, concealed wiring and automatic control technologies. At the same time, apparatus is charged or powered continuously without wire connection, thereby improving a home's safety, residential convenience and comfort. A high-efficiency, environmentally friendly and energy-efficient living environment is achieved.

Wireless energy transmission modes and mechanisms mainly include a magnetic induction coupling mode, an electromagnetic radiation mode and a magnetic resonance coupling mode. The magnetic resonance coupling mode has advantages in safety and transmission efficiency compared with the electromagnetic radiation mode, and an advantage in transmission distance compared with the magnetic induction coupling mode. A single-transmitting single-receiving design solution adopted by a magnetic-resonance wireless charging design for a medium-power electronic apparatus which is disclosed currently has many disadvantages, including:

(1) A single receiving board bears large load power, in order to guarantee working stability, an electronic device has high electrical parameter indexes, such as a withstand voltage and a current value, resulting in a large package size. Therefore, it is difficult to minimize the whole design solution, namely to reduce the weight and size of the device while meeting wireless charging built-in requirements of small household appliances and consumer electronic products in the market.

(2) When energy of a magnetic field is received by the single receiving board, the magnetic field is fixedly distributed between receiving and transmitting components due to the use of the one-to-one solution and thus has a low horizontal degree of freedom.

(3) In a case of medium power output, the single receiving board bears large load power, and a power device generates a large amount of heat, which is not conducive to long-term stable operation.

SUMMARY

Objectives of the present invention are to solve the technical problems of a large receiving-end volume, large power consumption, a low efficiency, poor stability, high heat generation, or the like, in the existing magnetic-resonance wireless charging design for wireless charging of a small medium-power electronic apparatus while meeting the built-in requirements of small household appliances and consumer electronic products for the wireless charging solution and user-friendly requirements for the electronic products in the market. Therefore, the present invention provides a multi-transmitting multi-receiving magnetic-resonance wireless charging system for a medium-power electronic apparatus.

The following technical solution is adopted in the present invention. A multi-transmitting multi-receiving magnetic-resonance wireless charging system for a medium-power electronic apparatus includes a magnetic-resonance transmitting module and a magnetic-resonance receiving module.

The magnetic-resonance transmitting module includes a transmitting-end Bluetooth-communication and control module and at least two magnetic-resonance transmitting channels. Each magnetic-resonance transmitting channel has an identical structure that includes a direct current/direct current (DC/DC) regulator module, a radio-frequency power amplifier source, a matching network and a magnetic-resonance transmitting antenna which are connected sequentially. Each DC/DC regulator module is electrically connected to the transmitting-end Bluetooth-communication and control module and an external adapter. Each matching network is connected to the transmitting-end Bluetooth-communication and control module.

The magnetic-resonance receiving module includes a receiving-end Bluetooth-communication and control module, a power synthesis and protocol module and at least two magnetic-resonance receiving channels. Each magnetic-resonance receiving channel has an identical structure that includes a magnetic-resonance receiving antenna, a receiving-antenna matching network, a rectifier and filter module, a primary regulator and filter module and a secondary regulator and filter module which are connected sequentially. The magnetic-resonance transmitting antenna is coupled with the magnetic-resonance receiving antenna in one-to-one correspondence. Each rectifier and filter module is connected to the receiving-end Bluetooth-communication and control module. The receiving-end Bluetooth-communication and control module is further in wireless communication with the transmitting-end Bluetooth-communication and control module. An output end of each secondary regulator and filter module is connected to an input end of the power synthesis and protocol module, and an output end of the power synthesis and protocol module is electrically connected to an external charging apparatus.

The present invention has the following advantages.

(1) A magnetic-field multi-transmitting multi-receiving solution adopted in the present invention ensures that the load power of channels is equally shared to reduce power bearing pressure of a single channel in a case of high output power, so as to reduce the weight and size of the device to meet the built-in requirements of the small medium-low-power household appliances and the consumer electronic products for the wireless charging solution.

(2) With the magnetic-field multi-transmitting multi-receiving solution adopted in the present invention, a balance degree of magnetic field coupling between the receiving and transmitting ends is increased effectively, and a degree of freedom in horizontal direction is increased, so that the receiving end may be freely moved in a transmitting area.

(3) In the present invention, a planar printed circuit board is adopted to process structures of the receiving antenna of the magnetic-resonance receiving module and the transmitting antenna of the magnetic-resonance transmitting module, which realizes miniaturization and integration of the system.

(4) In the present invention, corners of a coil are smoothed to reduce a loss resistance of the coil, increase a quality factor of the antenna, and improve the wireless energy transmission efficiency of the system.

(5) The system according to the present invention may be placed anywhere in a small space, such as a space under a desk, a space between boards, or the like, so as to provide stable required power for portable computers, tablet computers, LED lighting equipment, sound boxes, mobile communication terminals and consumer electronic products.

REFERENCE NUMERALS

Figure 1:
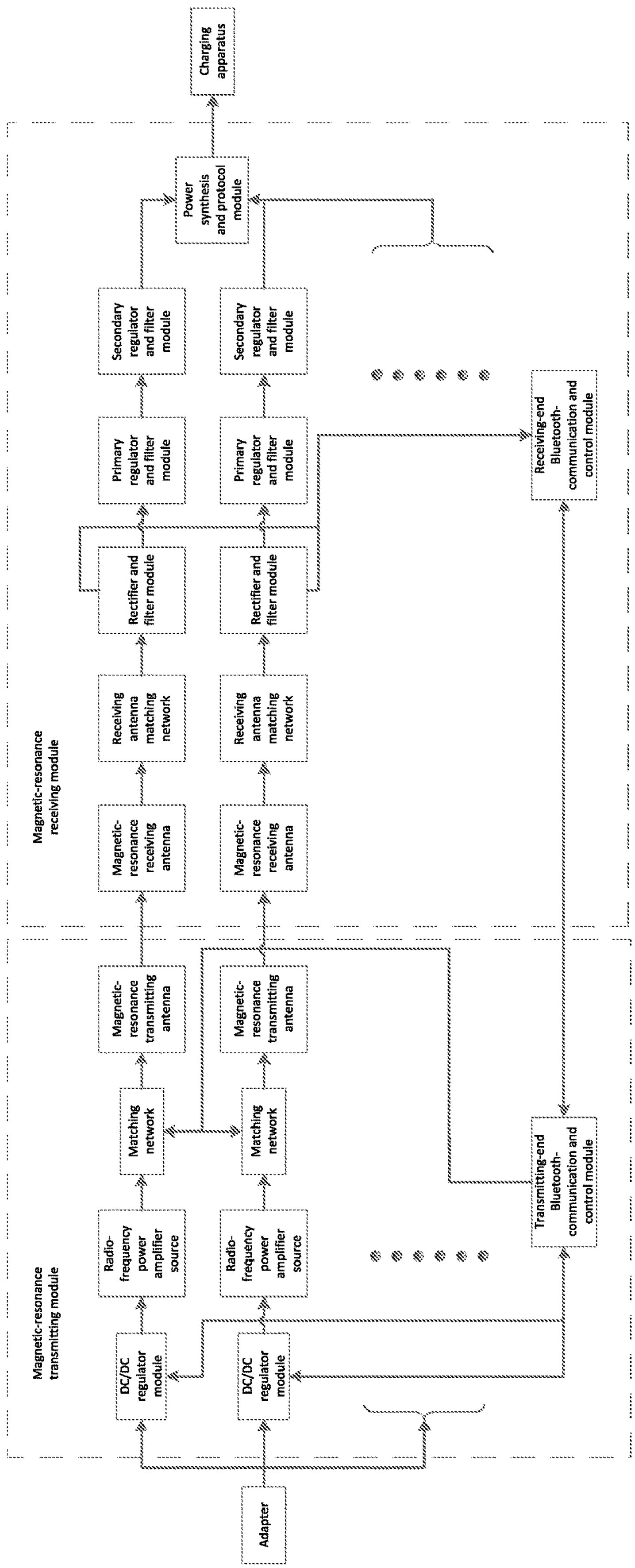
FIG. 1 shows a structural block diagram of a multi-transmitting multi-receiving magnetic-resonance wireless charging system for a medium-power electronic apparatus according to an embodiment of the present invention.

101—eleventh connection point
102—first receiving resonant antenna
103—thirteenth connection point
104—first electromagnetic energy output port
105—fourteenth connection point
106—second receiving resonant antenna
107—sixteenth connection point
108—second electromagnetic energy output port
109—third right-angle microstrip line
110—fourth right-angle microstrip line
111—third straight-line microstrip line 112—fourth straight-line microstrip line
113—twelfth connection point
114—fifteenth connection point
201—seventeenth connection point
202—third receiving resonant antenna
203—nineteenth connection point
204—fourth receiving resonant antenna
205—eighteenth connection point
206—twentieth connection point
301—twenty-first connection point
302—third microstrip line
303—twenty-third connection point
304—fourth microstrip line
305—twenty-second connection point
306—twenty-fourth connection point
401—first connection point
402—first transmitting resonant antenna
403—third connection point
404—second transmitting resonant antenna
405—first electromagnetic energy input port
406—second electromagnetic energy input port
407—second connection point
408—fourth connection point
409—first right-angle microstrip line
410—second right-angle microstrip line
411—first straight-line microstrip line
412—second straight-line microstrip line
501—fifth connection point
502—third transmitting resonant antenna
503—sixth connection point
504—fourth transmitting resonant antenna
601—seventh connection point
602—ninth connection point
603—first microstrip line
604—second microstrip line
605—eighth connection point
606—tenth connection point

DETAILED DESCRIPTION OF THE EMBODIMENTS

Exemplary embodiments of the present invention will be described in detail with reference to the drawings. It should be understood that the embodiments shown and described in the drawings are merely exemplary and are intended to illustrate the principles and spirit of the present invention, rather than to limit the scope of the present invention.

According to embodiments of the present invention, a multi-transmitting multi-receiving magnetic-resonance wireless charging system for a medium-power electronic apparatus includes a magnetic-resonance transmitting module and a magnetic-resonance receiving module, as shown in FIG. 1.

The magnetic-resonance transmitting module includes a transmitting-end Bluetooth-communication and control module and at least two magnetic-resonance transmitting channels. Each magnetic-resonance transmitting channel has an identical structure that includes a DC/DC regulator module, a radio-frequency power amplifier source, a matching network and a magnetic-resonance transmitting antenna which are connected sequentially. Each DC/DC regulator module is electrically connected to the transmitting-end Bluetooth-communication and control module and an external adapter. Each matching network is connected to the transmitting-end Bluetooth-communication and control module.

The magnetic-resonance receiving module includes a receiving-end Bluetooth-communication and control module, a power synthesis and protocol module and at least two magnetic-resonance receiving channels. Each magnetic-resonance receiving channel has an identical structure that includes a magnetic-resonance receiving antenna, a receiving-antenna matching network, a rectifier and filter module, a primary regulator and filter module and a secondary regulator and filter module which are connected sequentially. The magnetic-resonance transmitting antenna is coupled with the magnetic-resonance receiving antenna in one-to-one correspondence. Each rectifier and filter module is connected to the receiving-end Bluetooth-communication and control module. The receiving-end Bluetooth-communication and control module is further in wireless communication with the transmitting-end Bluetooth-communication and control module. The output end of each secondary regulator and filter module is connected to the input end of the power synthesis and protocol module, and the output end of the power synthesis and protocol module is electrically connected to an external charging apparatus.

Figure 2:
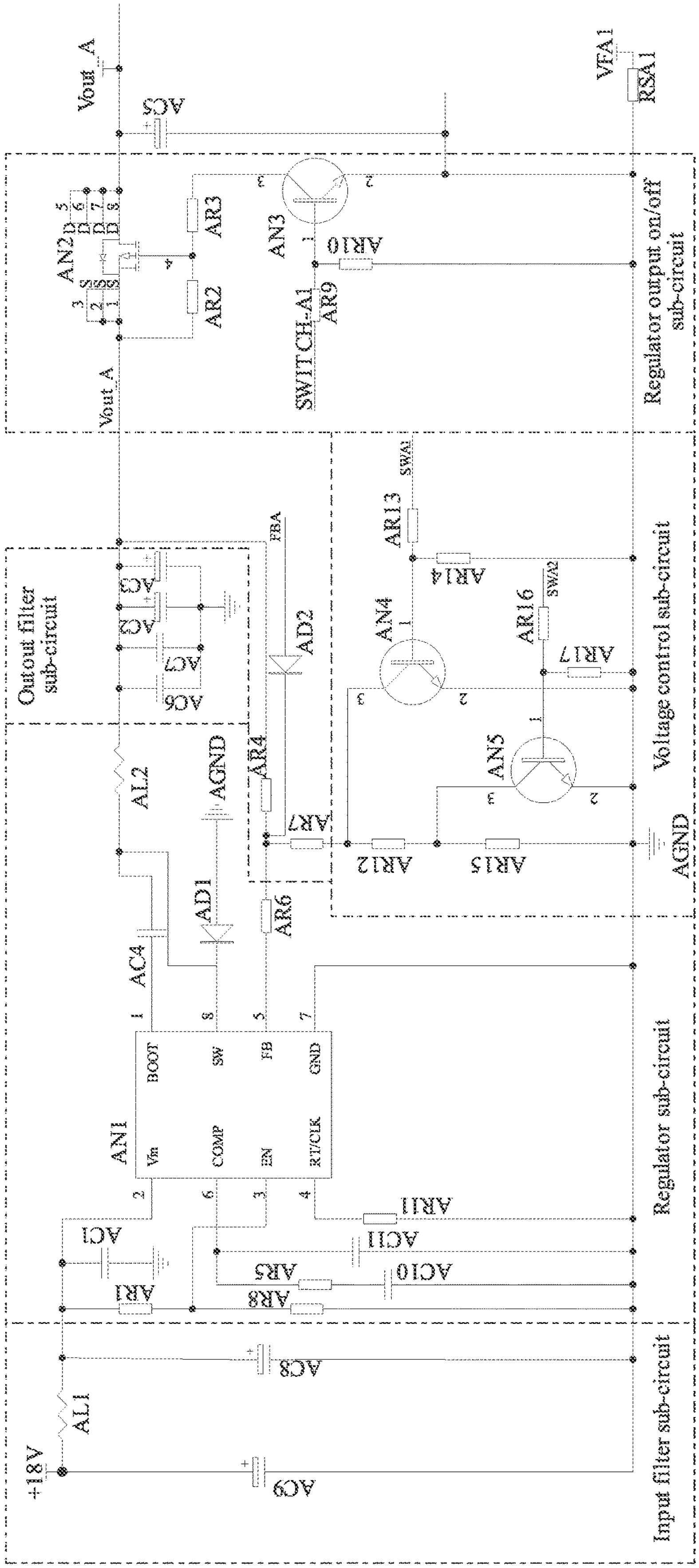
FIG. 2 shows a schematic diagram of a circuit structure of a DC/DC regulator module according to an embodiment of the present invention.

As shown in FIG. 2, the DC/DC regulator module includes the input filter sub-circuit, a regulator sub-circuit, a voltage control sub-circuit, the output filter sub-circuit and a regulator output on/off sub-circuit.

The input filter sub-circuit includes the polar capacitor AC8, the polar capacitor AC9 and the inductor AL1. One end of the inductor AL1 is connected to the anode of the polar capacitor AC8, and the other end of the inductor AL1 is connected to the anode of the polar capacitor AC9 to form a Pi-type filter structure. The cathode of the polar capacitor AC8 and the cathode of the polar capacitor AC9 are both grounded. A connection node of the inductor AL1 and the polar capacitor AC9 is further connected to a +18V supply voltage provided by the external adapter.

The regulator sub-circuit includes the regulator chip AN1. In an embodiment of the present invention, the model of the regulator chip AN1 is TPS54360. The pin Vin of the regulator chip AN1 is connected to the grounded capacitor AC1, one end of the resistor AR1 and the anode of the polar capacitor AC8, respectively. The pin COMP of the regulator chip AN1 is connected to the grounded capacitor AC11 and one end of the resistor AR5, respectively. The other end of the resistor AR5 is connected to the grounded capacitor AC10. The pin EN of the regulator chip AN1 is connected to the other end of the resistor AR1 and the grounded resistor AR8, respectively. The pin RT/CLK of the regulator chip AN1 is connected to the grounded resistor AR11. The pin GND of the regulator chip AN1 is grounded. The pin FB of the regulator chip AN1 is connected to one end of the resistor AR6. The other end of the resistor AR6 is connected to one end of the resistor AR4, one end of the resistor AR7 and the cathode of the diode AD2, respectively. The pin SW of the regulator chip AN1 is connected to the cathode of the diode AD1, one end of the capacitor AC4 and one end of the inductor AL2, respectively. The anode of the diode AD1 is grounded. The other end of the capacitor AC4 is connected to the pin BOOT of the regulator chip AN1.

The voltage control sub-circuit includes the triode AN4 and the triode AN5. The collector of the triode AN4 is connected to the other end of the resistor AR7 and one end of the resistor AR12, respectively. The base of the triode AN4 is connected to one end of the resistor AR13 and the grounded resistor AR14, respectively. The emitter of the triode AN4 is grounded. The collector of the triode AN5 is connected to the other end of the resistor AR12 and the grounded resistor AR15, respectively. The base of the triode AN5 is connected to one end of the resistor AR16 and the grounded resistor AR17, respectively. The emitter of the triode AN5 is grounded.

The output filter sub-circuit includes the polar capacitor AC2, the polar capacitor AC3, the grounded capacitor AC6 and the grounded capacitor AC7. The anode of the polar capacitor AC2 is connected to the anode of the polar capacitor AC3, the grounded capacitor AC6, the grounded capacitor AC7, the other end of the resistor AR4 and the other end of the inductor AL2, respectively. The cathode of the polar capacitor AC2 and the cathode of the polar capacitor AC3 are both grounded.

The regulator output on/off sub-circuit includes a metal oxide semiconductor (MOS) transistor AN2 and a triode AN3. The source of the MOS transistor AN2 is connected to one end of the resistor AR2 and the other end of the inductor AL2, respectively. The gate of the MOS transistor AN2 is connected to the other end of the resistor AR2 and one end of the resistor AR3, respectively. The drain of the MOS transistor AN2 is connected to the anode of the polar capacitor AC5. The collector of the triode AN3 is connected to the other end of the resistor AR3. The base of the triode AN3 is connected to one end of the resistor AR9 and the grounded resistor AR10, respectively. The emitter of the triode AN3 is connected to the cathode of the polar capacitor AC5 and one end of the resistor RSA1, respectively, and is grounded.

Figure 3:
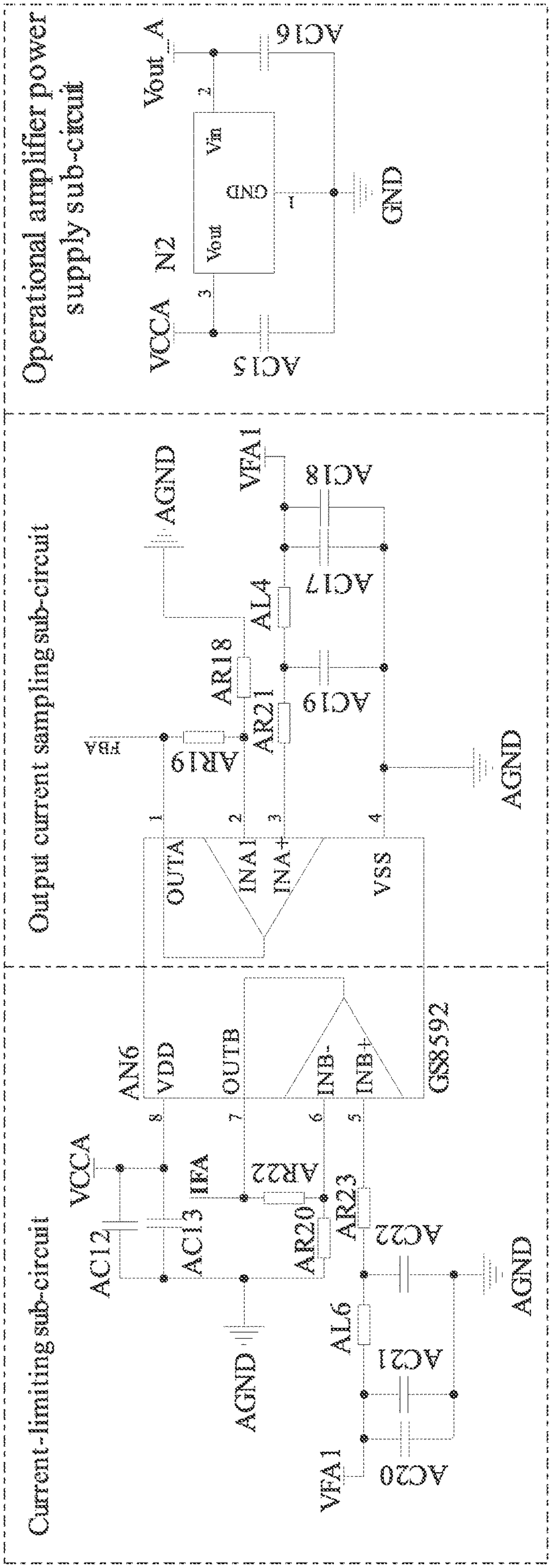
FIG. 3 shows a schematic diagram of a circuit structure of a radio-frequency power amplifier source according to an embodiment of the present invention.

As shown in FIG. 3, the radio-frequency power amplifier source includes a current-limiting sub-circuit, the output current sampling sub-circuit and an operational amplifier power supply sub-circuit.

The operational amplifier chip AN6 is shared by the current-limiting sub-circuit and the output current sampling sub-circuit. In an embodiment of the present invention, the model of the operational amplifier chip AN6 is GS8592. The pin VDD of the chip AN6 is connected to the grounded capacitor AC12 and the grounded capacitor AC13, respectively. The pin OUTB of the chip AN6 is connected to one end of the resistor AR22. The pin INB− of the chip AN6 is connected to the other end of the resistor AR22 and the grounded resistor AR20, respectively. The pin INB+ of the chip AN6 is connected to one end of the resistor AR23. The other end of the resistor AR23 is connected to one end of the resistor AL6 and the grounded capacitor AC22, respectively. The other end of the resistor AL6 is connected to the grounded capacitor AC20, the grounded capacitor AC21 and the other end of the resistor RSA1, respectively. The pin OUTA of the chip AN6 is connected to one end of the resistor AR19 and the anode of the diode AD2, respectively. The pin INA− of the chip AN6 is connected to the other end of the resistor AR19 and the grounded resistor AR18, respectively. The pin INA+ of the chip AN6 is connected to one end of the resistor AR21. The other end of the resistor AR21 is connected to one end of the resistor AL4 and the grounded capacitor AC19, respectively. The other end of the resistor AL4 is connected to the grounded capacitor AC17, the grounded capacitor AC 18 and the other end of the resistor RSA1, respectively. The pin VSS of the chip AN6 is grounded.

The operational amplifier power supply sub-circuit includes the regulator chip N2. In an embodiment of the present invention, the model of the regulator chip N2 is HT7333-1. The pin GND of the chip N2 is grounded. The pin Vin of the chip N2 is connected to the grounded capacitor AC16 and the drain of the MOS transistor AN2, respectively. The pin Vout of the chip N2 is connected to the grounded capacitor AC15 and the pin VDD of the chip AN6, respectively.

Figure 4:
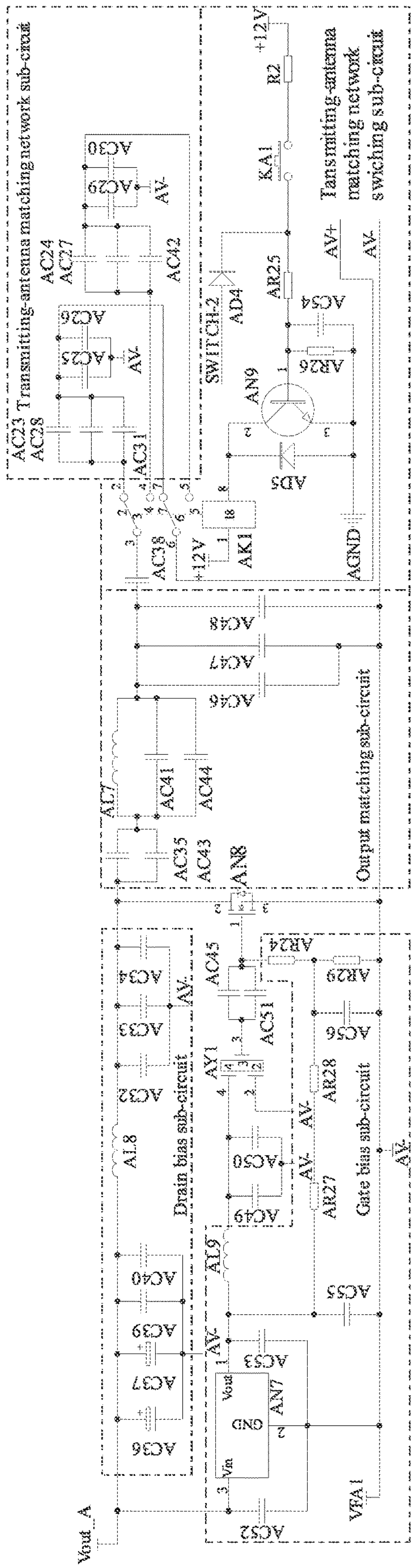
FIG. 4 shows a schematic diagram of a circuit structure of a matching network according to an embodiment of the present invention.

As shown in FIG. 4, the matching network includes a drain bias sub-circuit, a gate bias sub-circuit, the output matching sub-circuit, a transmitting-antenna matching network sub-circuit and a transmitting-antenna matching network switching sub-circuit.

The drain bias sub-circuit includes the inductor AL8. One end of the inductor AL8 is connected to the anode of the polar capacitor AC36, the anode of the polar capacitor AC37, one end of the capacitor AC39, one end of the capacitor AC40 and the pin Vin of the chip N2, respectively. The other end of the inductor AL8 is connected to one end of the capacitor AC32, one end of the capacitor AC33 and one end of the capacitor AC34, respectively. The cathode of the polar capacitor AC36, the cathode of the polar capacitor AC37, the other end of the capacitor AC39, the other end of the capacitor AC40, the other end of the capacitor AC32, the other end of the capacitor AC33 and the other end of the capacitor AC34 are all connected to an electromagnetic energy input port AV− of the magnetic-resonance transmitting antenna.

The gate bias sub-circuit includes a regulator chip AN7. In an embodiment of the present invention, the model of the regulator chip AN7 is 78L05. The pin Vin of the chip AN7 is connected to one end of the capacitor AC52 and the pin Vin of the chip N2, respectively. The pin GND of the chip AN7 is connected to the other end of the capacitor AC52, one end of the capacitor AC53, the other end of the resistor RSA1 and the electromagnetic energy input port AV− of the magnetic-resonance transmitting antenna, respectively. The pin Vout of the chip AN7 is connected to the other end of the capacitor AC53, one end of the capacitor AC55, one end of the resistor AR27 and one end of the inductor AL9, respectively. The other end of the inductor AL9 is connected to one end of the capacitor AC49, one end of the capacitor AC50 and the 4$^{th}$ pin of the connector AY1, respectively. The 3$^{rd}$ pin of the connector AY1 is connected to one end of the capacitor AC45 and one end of the capacitor AC51, respectively. The other end of the resistor AR27 is connected to one end of the capacitor AC56, one end of the resistor AR24 and one end of the resistor AR29 through the resistor AR28, respectively. The other end of the resistor AR24 is connected to the other end of the capacitor AC45, the other end of the capacitor AC51 and the gate of the MOS transistor AN8, respectively. The drain of the MOS transistor AN8 is connected to the other end of the inductor AL8. The source of the MOS transistor AN8, the 2$^{nd}$ pin of the connector AY1, the other end of the capacitor AC49, the other end of the capacitor AC50, the other end of the capacitor AC55, the other end of the capacitor AC56 and the other end of the resistor AR29 are all connected to the electromagnetic energy input port AV− of the magnetic-resonance transmitting antenna.

The output matching sub-circuit includes the inductor AL7. One end of the inductor AL7 is connected to one end of the capacitor AC35, one end of the capacitor AC41, one end of the capacitor AC43 and one end of the capacitor AC44, respectively. The other end of the inductor AL7 is connected to the other end of the capacitor AC41, the other end of the capacitor AC44, one end of the capacitor AC46, one end of the capacitor AC47 and one end of the capacitor AC48, respectively. The other end of the capacitor AC35 and the other end of the capacitor AC43 are both connected to the other end of the inductor AL8. The other end of the capacitor AC46, the other end of the capacitor AC47 and the other end of the capacitor AC48 are all connected to the electromagnetic energy input port AV− of the magnetic-resonance transmitting antenna.

The transmitting-antenna matching network switching sub-circuit includes the triode AN9. The collector of the triode AN9 is connected to the cathode of the diode AD5 and the second control port of the switch AK1, respectively. The base of the triode AN9 is connected to one end of the resistor AR26, one end of the capacitor AC54 and one end of the resistor AR25, respectively. The emitter of the triode AN9 is connected to the anode of the diode AD5, the other end of the resistor AR26 and the other end of the capacitor AC54, respectively, and is grounded. The other end of the resistor AR25 is connected to one end of the switch KA1 and the cathode of the diode AD4, respectively. The other end of the switch KA1 is connected to one end of the resistor R2. The first movable contact of the switch AK1 is connected to the other end of the inductor AL7 through the capacitor AC38, and the second movable contact of the switch AK1 is connected to an electromagnetic energy input port AV+ of the magnetic-resonance transmitting antenna.

The transmitting-antenna matching network sub-circuit includes the capacitor AC23, the capacitor AC24, the capacitor AC25, the capacitor AC26, the capacitor AC27, the capacitor AC28, the capacitor AC29, the capacitor AC30, the capacitor AC31, and the capacitor AC42. The first fixed contact of the switch AK1 is connected to one end of the capacitor AC23, one end of the capacitor AC28 and one end of the capacitor AC31, respectively. The second fixed contact of the switch AK1 is connected to one end of the capacitor AC24, one end of the capacitor AC27 and one end of the capacitor AC42, respectively. The third fixed contact of the switch AK1 is connected to the other end of the capacitor AC23, the other end of the capacitor AC28, the other end of the capacitor AC31, one end of the capacitor AC25 and one end of the capacitor AC26, respectively. The fourth fixed contact of the switch AK1 is connected to the other end of the capacitor AC24, the other end of the capacitor AC27, the other end of the capacitor AC42, one end of the capacitor AC29 and one end of the capacitor AC30, respectively. The other end of the capacitor AC25, the other end of the capacitor AC26, the other end of the capacitor AC29 and the other end of the capacitor AC30 are all connected to the electromagnetic energy input port AV− of the magnetic-resonance transmitting antenna.

Figure 5:
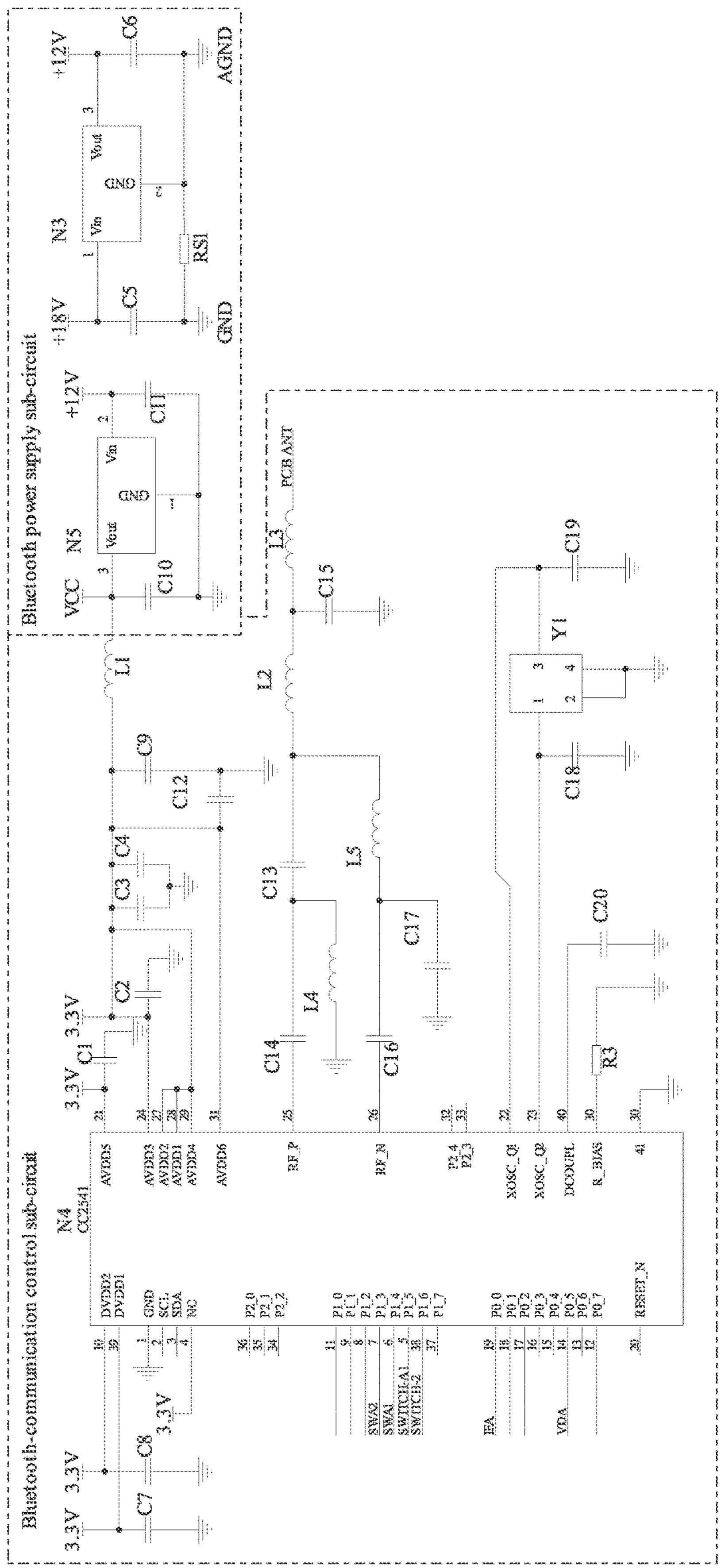
FIG. 5 shows a schematic diagram of a circuit structure of a transmitting-end Bluetooth-communication and control module according to an embodiment of the present invention.

As shown in FIG. 5, the transmitting-end Bluetooth-communication and control module includes a Bluetooth-communication control sub-circuit and a Bluetooth power supply sub-circuit.

The Bluetooth-communication control sub-circuit includes the single chip microcomputer chip N4. In an embodiment of the present invention, the model of the single chip microcomputer chip N4 is CC2541. The pin DVDD2 of the chip N4 is connected to a 3.3V power source and the grounded capacitor C8, respectively. The pin DVDD1 of the chip N4 is connected to the 3.3V power source and the grounded capacitor C7, respectively. The pin NC of the chip N4 is connected to the 3.3V power source. The pin P1_3 of the chip N4 is connected to the other end of the resistor AR16. The pin P1_4 of the chip N4 is connected to the other end of the resistor AR13. The pin P1_5 of the chip N4 is connected to the other end of the resistor AR9. The pin P1_6 of the chip N4 is connected to the anode of the diode AD4. The pin P0_0 of the chip N4 is connected to the pin OUTB of the chip AN6. The pin GND of the chip N4 and the pin 41 of the chip N4 are both grounded. The pin R_BIAS of the chip N4 is connected to the grounded resistor R3. The pin DCOUPL of the chip N4 is connected to the grounded capacitor C20. The pin XOSC_Q2 of the chip N4 is connected to the grounded capacitor C18 and the 1st pin of the connector Y1, respectively. The pin XOSC_Q1 of the chip N4 is connected to the grounded capacitor C19 and the 3rd pin of the connector Y1, respectively. The 2nd pin and the 4th pin of the connector Y1 are grounded. The pin RF_N of the chip N4 is connected to the grounded capacitor C17 and one end of the inductor L5 through the capacitor C16. The pin RF_P of the chip N4 is connected to the grounded inductor L4 and one end of the capacitor C13 through the capacitor C14. The other end of the capacitor C13 is connected to the other end of the inductor L5 and one end of the inductor L2, respectively. The other end of the inductor L2 is connected to one end of the inductor L3 and the grounded capacitor C15, respectively. The other end of the inductor L3 is connected to the antenna PCBANT. The pin AVDD1 of the chip N4 is connected to the pin AVDD2 of the chip N4, the pin AVDD3 of the chip N4, the pin AVDD4 of the chip N4, the pin AVDD6 of the chip N4, the grounded capacitor C2, the grounded capacitor C3, the grounded capacitor C4, the grounded capacitor C9, the grounded capacitor C12, one end of the inductor L1 and the 3.3V power source, respectively. The pin AVDD5 of the chip N4 is connected to the grounded capacitor C1 and the 3.3V power source, respectively.

The Bluetooth power supply sub-circuit includes the regulator chip N3 and the regulator chip N5. In an embodiment of the present invention, the model of the regulator chip N3 is 78M12, and the model of the regulator chip N5 is HT7333-1. The pin Vin of the chip N3 is connected to the grounded capacitor C5 and the +18V supply voltage provided by the external adapter, respectively. The pin GND of the chip N3 is connected to the grounded resistor RS1. The pin Vout of the chip N3 is connected to the grounded capacitor C6, the other end of the resistor R2 and the first control port of the switch AK1, respectively. The pin Vout of the chip N5 is connected to the grounded capacitor C10 and the other end of the inductor L1, respectively, and serves as the power supply terminal VCC of the Bluetooth power supply sub-circuit. The pin GND of the chip N5 is grounded. The pin Vin of the chip N5 is connected to the grounded capacitor C11, the other end of the resistor R2 and the first control port of the switch AK1, respectively.

In an embodiment of the present invention, the magnetic-resonance transmitting antenna includes a first transmitting-antenna dielectric substrate, a second transmitting-antenna dielectric substrate and a third transmitting-antenna dielectric substrate which are arranged from top to bottom in sequence. Each of the three transmitting-antenna dielectric substrates is printed with a circuit, which may be processed through a printed circuit process.

Figure 6:
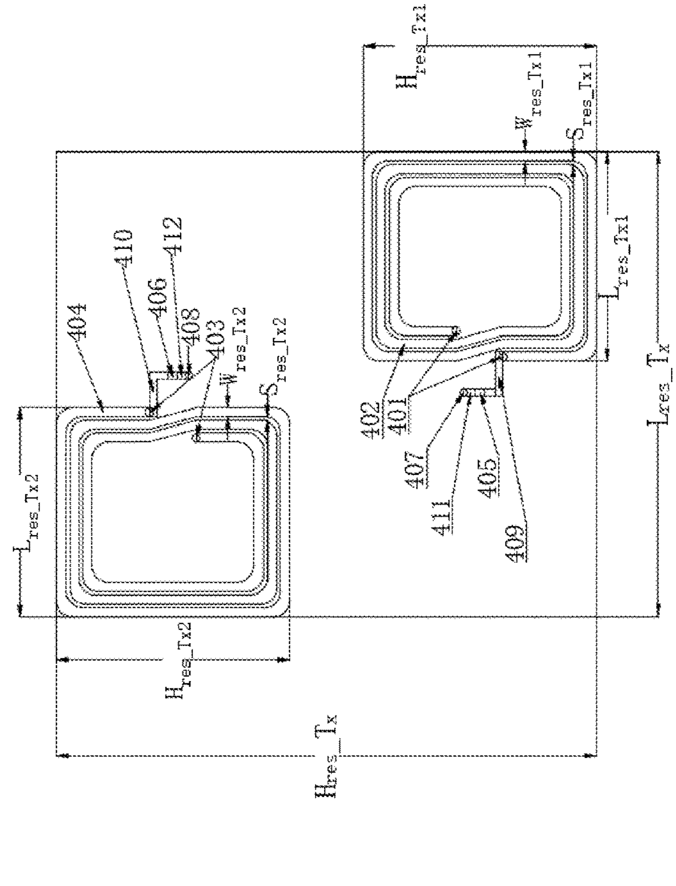
FIG. 6 shows a schematic structural diagram of the top surface of a first transmitting-antenna dielectric substrate according to an embodiment of the present invention.

As shown in FIG. 6, the first transmitting resonant antenna 402 and the second transmitting resonant antenna 404 are printed at opposite corners of the top surface of the first transmitting-antenna dielectric substrate. Each of the first transmitting resonant antenna 402 and the second transmitting resonant antenna 404 is configured as a rectangular helical antenna with a notch. The first connection point 401 is provided at an internal notch endpoint and an external notch endpoint of the first transmitting resonant antenna 402, respectively. The external notch endpoint of the first transmitting resonant antenna 402 is connected to one end of the first right-angle microstrip line 409 through the first connection point 401. The other end of the first right-angle microstrip line 409 is connected to one end of the first straight-line microstrip line 411 through the first electromagnetic energy input port 405. The second connection point 407 is provided at the other end of the first straight-line microstrip line 411. The third connection point 403 is provided at an internal notch endpoint and an external notch endpoint of the second transmitting resonant antenna 404, respectively. The external notch endpoint of the second transmitting resonant antenna 404 is connected to one end of the second right-angle microstrip line 410 through the third connection point 403. The other end of the second right-angle microstrip line 410 is connected to one end of the second straight-line microstrip line 412 through the second electromagnetic energy input port 406. The fourth connection point 408 is provided at the other end of the second straight-line microstrip line 412.

In an embodiment of the present invention, the first electromagnetic energy input port 405 and the second electromagnetic energy input port 406 correspond to the electromagnetic energy input port AV+ and the electromagnetic energy input port AV− of the magnetic-resonance transmitting antenna, respectively.

Figure 7:
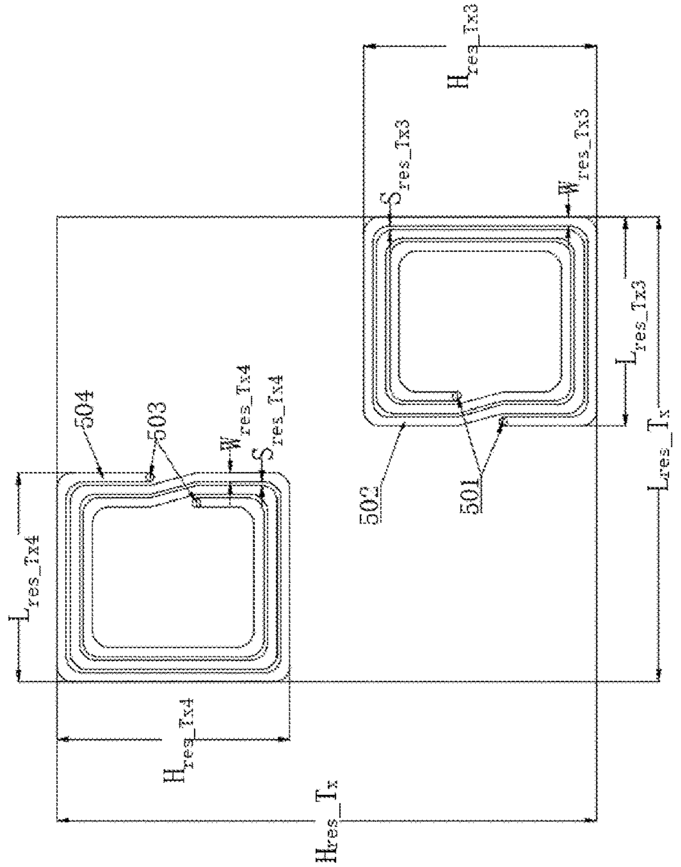
FIG. 7 shows a schematic structural diagram of the top surface of a second transmitting-antenna dielectric substrate according to an embodiment of the present invention.

As shown in FIG. 7, the third transmitting resonant antenna 502 and the fourth transmitting resonant antenna 504 are printed at opposite corners of the top surface of the second transmitting-antenna dielectric substrate. Each of the third transmitting resonant antenna 502 and the fourth transmitting resonant antenna 504 is configured as a rectangular helical antenna with a notch. The fifth connection point 501 is provided at an internal notch endpoint and an external notch endpoint of the third transmitting resonant antenna 502, respectively, and the fifth connection point 501 is connected to the first connection point 401 through a through hole. The sixth connection point 503 is provided at an internal notch endpoint and an external notch endpoint of the fourth transmitting resonant antenna 504, respectively, and the sixth connection point 503 is connected to the third connection point 403 through a through hole.

Figure 8:
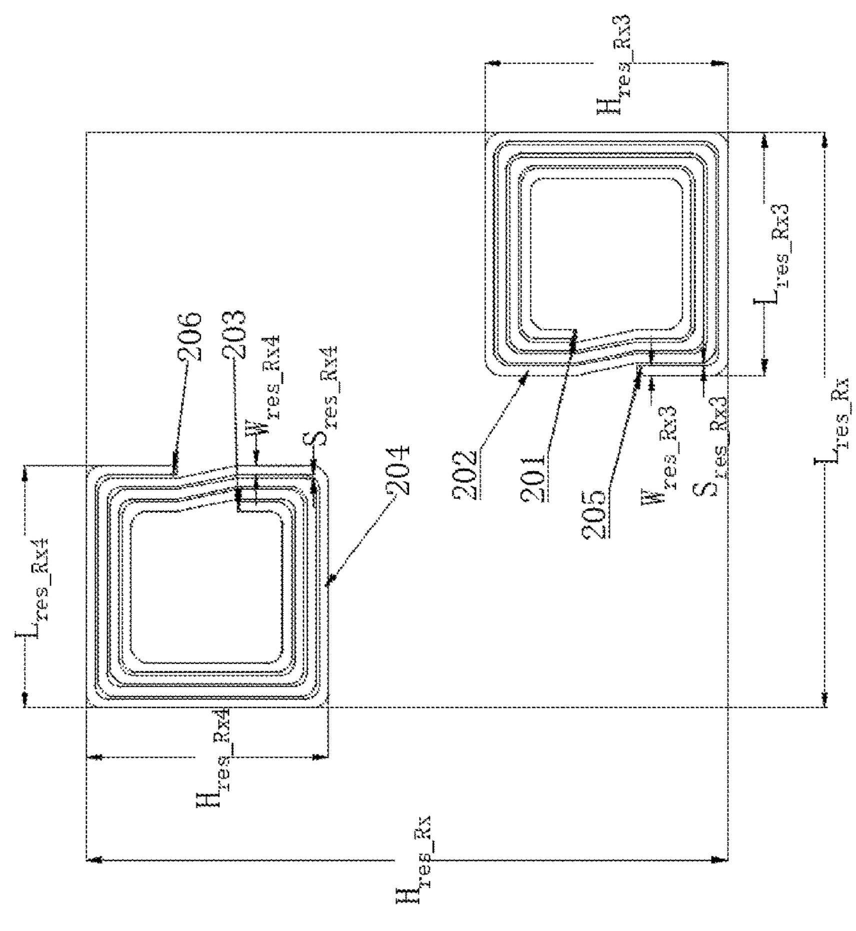
FIG. 8 shows a schematic structural diagram of the bottom surface of a third transmitting-antenna dielectric substrate according to an embodiment of the present invention.

As shown in FIG. 8, the first microstrip line 603 and the second microstrip line 604 are printed at the bottom surface of the third transmitting-antenna dielectric substrate. The seventh connection point 601 and the eighth connection point 605 are provided at both ends of the first microstrip line 603, respectively. The seventh connection point 601 is connected to the second connection point 407 through a through hole. The eighth connection point 605 is connected to the first connection point 401 and the fifth connection point 501 through a through hole, respectively. The ninth connection point 602 and the tenth connection point 606 are provided at both ends of the second microstrip line 604, respectively. The ninth connection point 602 is connected to the fourth connection point 408 through a through hole. The tenth connection point 606 is connected to the third connection point 403 and the sixth connection point 503 through a through hole, respectively.

In an embodiment of the present invention, a corner of each of the first transmitting resonant antenna 402, the second transmitting resonant antenna 404, the third transmitting resonant antenna 502 and the fourth transmitting resonant antenna 504 is shaped as a smooth circular arc structure.

In an embodiment of the present invention, the magnetic-resonance receiving antenna includes a first receiving-antenna dielectric substrate, a second receiving-antenna dielectric substrate and a third receiving-antenna dielectric substrate which are arranged from top to bottom in sequence. Each of the three receiving-antenna dielectric substrates is printed with a circuit which, which may be processed by a printed circuit process.

Figure 9:
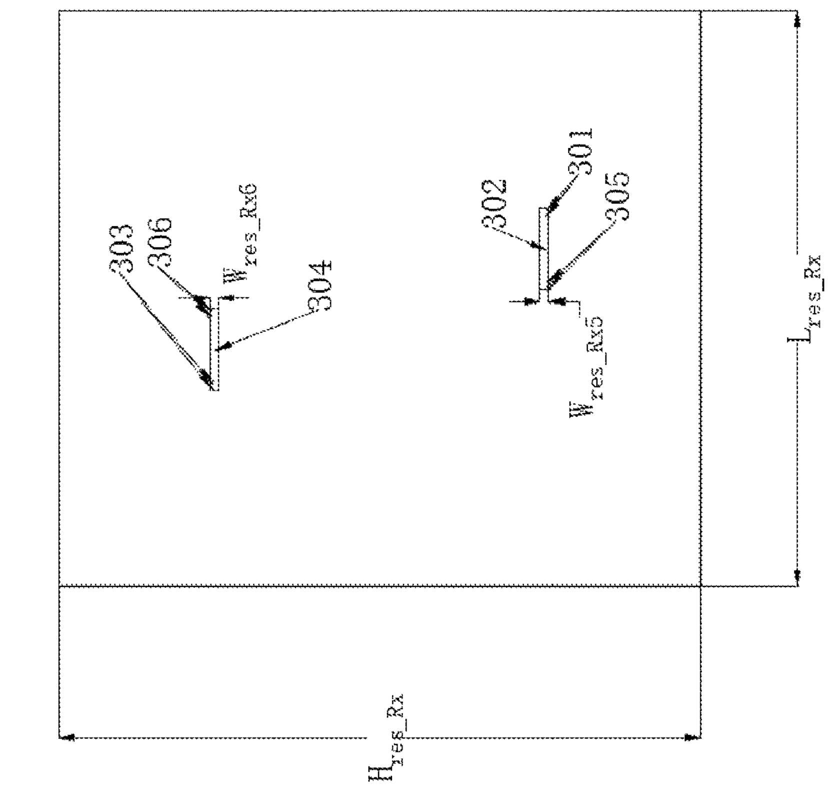
FIG. 9 shows a schematic structural diagram of the top surface of a first receiving-antenna dielectric substrate according to an embodiment of the present invention.

As shown in FIG. 9, the first receiving resonant antenna 102 and the second receiving resonant antenna 106 are printed at opposite corners of the top surface of the first receiving-antenna dielectric substrate. Each of the first receiving resonant antenna 102 and the second receiving resonant antenna 106 is configured as a rectangular helical antenna with a notch. The eleventh connection point 101 is provided at an internal notch endpoint of the first receiving resonant antenna 102, and the twelfth connection point 113 is provided at an external notch endpoint of the first receiving resonant antenna 102. The external notch endpoint of the first receiving resonant antenna 102 is connected to one end of the third right-angle microstrip line 109 through the twelfth connection point 113. The other end of the third right-angle microstrip line 109 is connected to one end of the third straight-line microstrip line 111 through the first electromagnetic energy output port 104. The thirteenth connection point 103 is provided at the other end of the third straight-line microstrip line 111. The fourteenth connection point 105 is provided at an internal notch endpoint of the second receiving resonant antenna 106, and the fifteenth connection point 114 is provided at an external notch endpoint of the second receiving resonant antenna 106. The external notch endpoint of the second receiving resonant antenna 106 is connected to one end of the fourth right-angle microstrip line 110 through the fifteenth connection point 114. The other end of the fourth right-angle microstrip line 110 is connected to one end of the fourth straight-line microstrip line 112 through the second electromagnetic energy output port 108. The sixteenth connection point 107 is provided at the other end of the fourth straight-line microstrip line 112.

Figure 10:
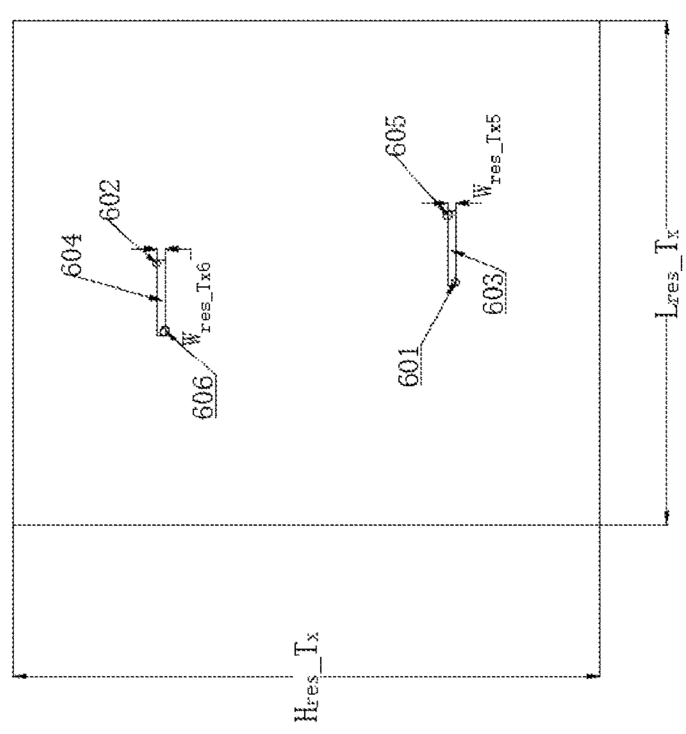
FIG. 10 shows a schematic structural diagram of the top surface of a second receiving-antenna dielectric substrate according to an embodiment of the present invention.

As shown in FIG. 10, the third receiving resonant antenna 202 and the fourth receiving resonant antenna 204 are printed at opposite corners of the top surface of the second receiving-antenna dielectric substrate. Each of the third receiving resonant antenna 202 and the fourth receiving resonant antenna 204 is configured as a rectangular helical antenna with a notch. The seventeenth connection point 201 is provided at an internal notch endpoint of the third receiving resonant antenna 202, and the eighteenth connection point 205 is provided at an external notch endpoint of the third receiving resonant antenna 202. The seventeenth connection point 201 is connected to the eleventh connection point 101 through a through hole, and the eighteenth connection point 205 is connected to the twelfth connection point 113 through a through hole. The nineteenth connection point 203 is provided at an internal notch endpoint of the fourth receiving resonant antenna 204, and the twentieth connection point 206 is provided at an external notch endpoint of the fourth receiving resonant antenna 204. The nineteenth connection point 203 is connected to the fourteenth connection point 105 through a through hole, and the twentieth connection point 206 is connected to the fifteenth connection point 114 through a through hole.

Figure 11:
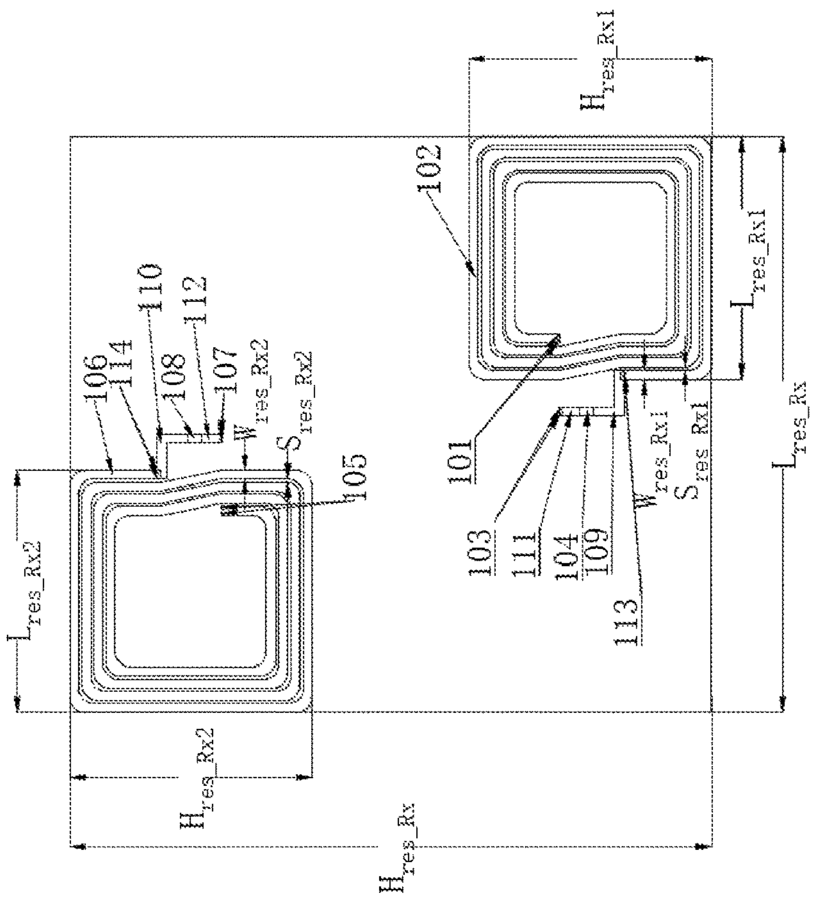
FIG. 11 shows a schematic structural diagram of the bottom surface of a third receiving-antenna dielectric substrate according to an embodiment of the present invention.

As shown in FIG. 11, the third microstrip line 302 and the fourth microstrip line 304 are printed at the bottom surface of the third receiving-antenna dielectric substrate. The twenty-first connection point 301 and the twenty-second connection point 305 are provided at both ends of the third microstrip line 302, respectively. The twenty-first connection point 301 is connected to the seventeenth connection point 201 and the eleventh connection point 101 through a through hole, respectively. The twenty-second connection point 305 is connected to the thirteenth connection point 103 through a through hole. The twenty-third connection point 303 and the twenty-fourth connection point 306 are provided at both ends of the fourth microstrip line 304, respectively. The twenty-third connection point 303 is connected to the nineteenth connection point 203 and the fourteenth connection point 105 through a through hole, respectively. The twenty-fourth connection point 306 is connected to the sixteenth connection point 107 through a through hole.

In an embodiment of the present invention, a corner of each of the first receiving resonant antenna 102, the second receiving resonant antenna 106, the third receiving resonant antenna 202, and the fourth receiving resonant antenna 204 is shaped as a smooth circular arc structure.

In an embodiment of the present invention, according to the reference numerals in the structural diagrams shown in FIGS. 6-11, geometric parameters and electrical parameters of the magnetic-resonance transmitting antenna and the magnetic-resonance receiving antenna are set as follows in conjunction with practical application requirements.

| Symbol | Value (range) |
|---|---|
| $H_{res\_Tx}$ | 10 mm-800 mm |
| $L_{res\_Tx}$ | 10 mm-800 mm |
| $H_{res\_Tx1}$, $H_{res\_Tx2}$, $H_{res\_Tx3}$, $H_{res\_Tx4}$ | 5 mm-400 mm |
| $L_{res\_Tx1}$, $L_{res\_Tx2}$, $L_{res\_Tx3}$, $L_{res\_Tx4}$ | 5 mm-400 mm |
| $W_{res\_Tx1}$, $W_{res\_Tx2}$, $W_{res\_Tx3}$, $W_{res\_Tx4}$, $W_{res\_Tx5}$, $W_{res\_Tx6}$ | 1 mm-6 mm |
| $S_{res\_Tx1}$, $S_{res\_Tx2}$, $S_{res\_Tx3}$, $S_{res\_Tx4}$ | 0.5 mm-2 mm |
| $H_{res\_Rx}$ | 10 mm-800 mm |
| $L_{res\_Rx}$ | 10 mm-800 mm |
| $H_{res\_Rx1}$, $H_{res\_Rx2}$, $H_{res\_Rx3}$, $H_{res\_Rx4}$ | 5 mm-400 mm |
| $L_{resRx1}$, $L_{res\_Rx2}$, $L_{res\_Rx3}$, $L_{res\_Rx4}$ | 5 mm-400 mm |
| $W_{res\_Rx1}$, $W_{res\_Rx2}$, $W_{res\_Rx3}$, $W_{res\_Rx4}$, $W_{res\_Rx5}$, $W_{res\_Rx6}$ | 1 mm-6 mm |
| $S_{res\_Rx1}$, $S_{res\_Rx2}$, $S_{res\_Rx3}$, $S_{res\_Rx4}$ | 0.5 mm-2 mm |
| Transmitting resonant capacitance value | 600 pF |
| Receiving resonant capacitance value | 300 pF |

Figure 12:
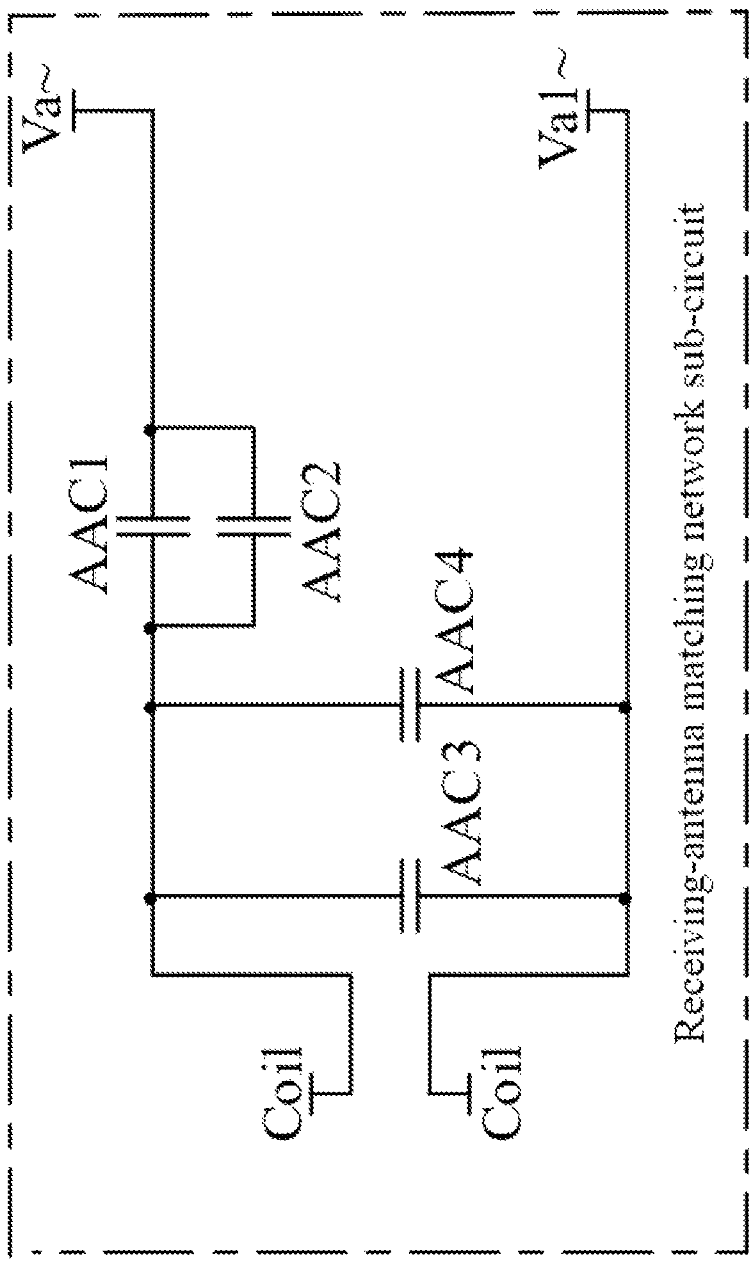
FIG. 12 shows a schematic diagram of a circuit structure of a receiving-antenna matching network according to an embodiment of the present invention.

As shown in FIG. 12, the receiving-antenna matching network includes the capacitor AAC1, the capacitor AAC2, the capacitor AAC3 and the capacitor AAC4. One end of the capacitor AAC1 is connected to one end of the capacitor AAC2, one end of the capacitor AAC3, one end of the capacitor AAC4 and an electromagnetic energy output port Coil of the magnetic-resonance receiving antenna, respectively. The other end of the capacitor AAC1 is connected to the other end of the capacitor AAC2. The other end of the capacitor AAC3 is connected to the other end of the capacitor AAC4 and an electromagnetic energy output port Coil of the magnetic-resonance receiving antenna, respectively.

In an embodiment of the present invention, the first electromagnetic energy output port 104 and the second electromagnetic energy output port 108 correspond to the two electromagnetic energy output ports Coil, respectively.

Figure 13:
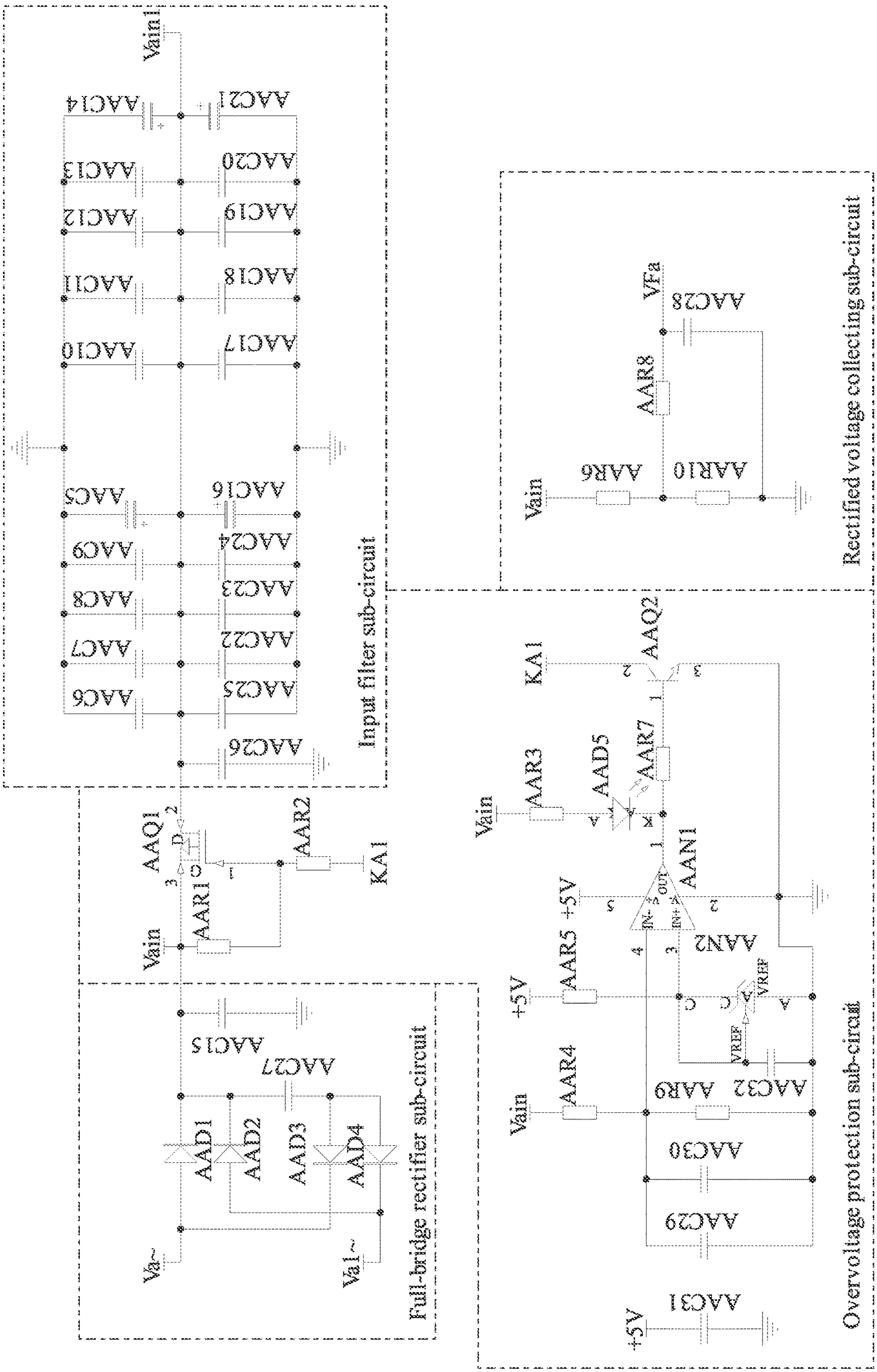
FIG. 13 shows a schematic diagram of a circuit structure of a rectifier and filter module according to an embodiment of the present invention.
Figure 14:
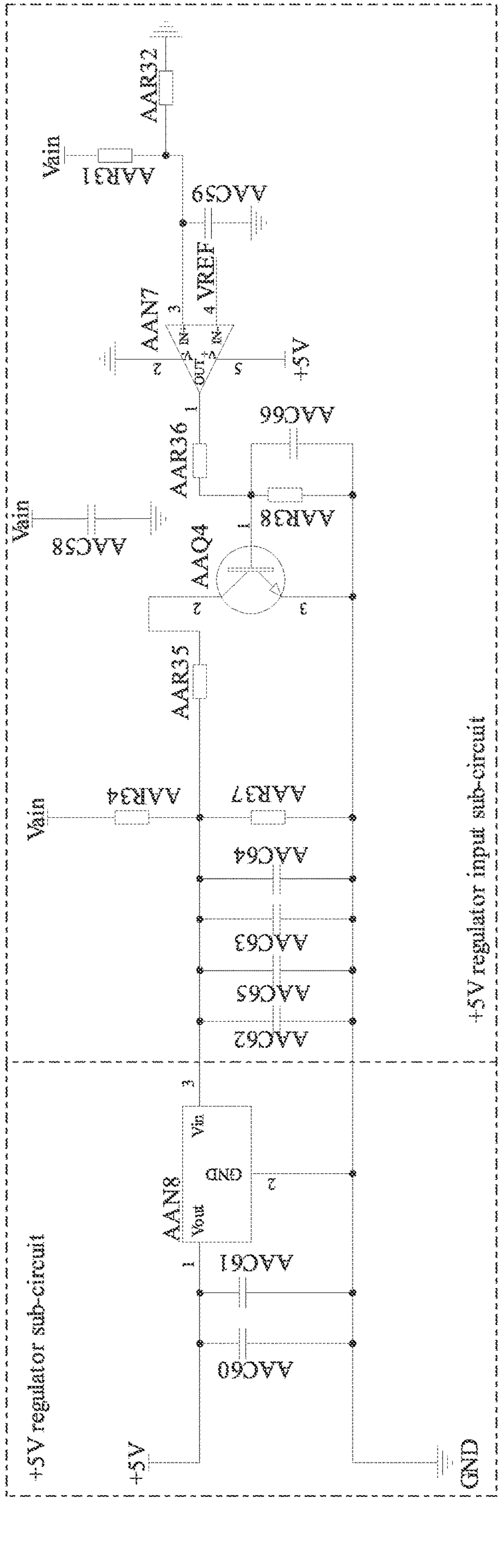
FIG. 14 shows a schematic diagram of a circuit structure of a +5V power supply circuit of the rectifier and filter module according to an embodiment of the present invention.

As shown in FIGS. 13-14, the rectifier and filter module includes a full-bridge rectifier sub-circuit, an overvoltage protection sub-circuit, the input filter sub-circuit, a rectified voltage collecting sub-circuit, a +5V regulator sub-circuit, and a +5V regulator input sub-circuit.

The full-bridge rectifier sub-circuit includes the diode AAD1, the diode AAD2, the diode AAD3 and the diode AAD4. The anode of the diode AAD1 is connected to the cathode of the diode AAD3 and the other end of the capacitor AAC1, respectively. The cathode of the diode AAD1 is connected to the cathode of the diode AAD2, one end of the capacitor AAC27 and the grounded capacitor AAC15, respectively. The anode of the diode AAD2 is connected to the cathode of the diode AAD4 and the other end of the capacitor AAC4, respectively. The anode of the diode AAD3 is connected to the anode of the diode AAD4 and the other end of the capacitor AAC27, respectively.

The overvoltage protection sub-circuit includes a comparator chip AAN1. In an embodiment of the present invention, the model of the comparator chip AAN1 is TP1941. The non-inverting input terminal of the chip AAN1 is connected to one end of the resistor AAR5, the cathode terminal of the diode chip AAN2, the reference voltage terminal of the diode chip AAN2 and the grounded capacitor AAC32, respectively. The inverting input terminal of the chip AAN1 is connected to one end of the resistor AAR4, the grounded resistor AAR9, the grounded capacitor AAC29 and the grounded capacitor AAC30, respectively. The voltage terminal of the chip AAN1 is connected to the grounded capacitor AAC31 and the other end of the resistor AAR5, respectively. The grounded terminal of the chip AAN1 is connected to the anode terminal of the diode chip AAN2 and the emitter of the triode AAQ2, respectively, and is grounded. The output terminal of the chip AAN1 is connected to one end of the resistor AAR7 and the cathode of the diode AAD5, respectively. The anode of the diode AAD5 is connected to one end of the resistor AAR3. The other end of the resistor AAR7 is connected to the base of the triode AAQ2. The collector of the triode AAQ2 is connected to one end of the resistor AAR1 and the gate of the MOS transistor AAQ1 through the resistor AAR2, respectively. The source of the MOS transistor AAQ1 is connected to the other end of the resistor AAR1 and the cathode of the diode AAD1, respectively.

The input filter sub-circuit includes the polar capacitor AAC5, the polar capacitor AAC14, the polar capacitor AAC16 and the polar capacitor AAC21. The anode of the polar capacitor AAC5 is connected to the anode of the polar capacitor AAC14, the anode of the polar capacitor AAC16, the anode of the polar capacitor AAC21, the grounded capacitors AAC6-AAC13, the grounded capacitors AAC17-AAC20, the grounded capacitors AAC22-AAC26 and the drain of the MOS transistor AAQ1, respectively. The cathode of the polar capacitor AAC5, the cathode of the polar capacitor AAC14, the cathode of the polar capacitor AAC16, and the cathode of the polar capacitor AAC21 are all grounded.

The rectified voltage collecting sub-circuit includes the resistor AAR6. One end of the resistor AAR6 is connected to the source of the MOS transistor AAQ1, the other end of the resistor AAR3 and the other end of the resistor AAR4, respectively. The other end of the resistor AAR6 is connected to one end of the resistor AAR8 and the grounded resistor AAR10, respectively. The other end of the resistor AAR8 is connected to the grounded capacitor AAC28.

The +5V regulator sub-circuit includes the regulator chip AAN8. In an embodiment of the present invention, the model of the regulator chip AAN8 is 78L05. The pin Vout of the chip AAN8 is connected to the grounded capacitor AAC60, the grounded capacitor AAC61 and the other end of the resistor AAR5, respectively. The pin GND of the chip AAN8 is grounded.

The +5V regulator input sub-circuit includes the comparator chip AAN7. In an embodiment of the present invention, the model of the comparator chip AAN7 is TP1941. The non-inverting input terminal of the chip AAN7 is connected to one end of the resistor AAR31, the grounded resistor AAR32 and the grounded capacitor AAC59, respectively. The inverting input terminal of the chip AAN7 is connected to a reference voltage VREF. The voltage terminal of the chip AAN7 is connected to the pin Vout of the chip AAN8. The grounded terminal of the chip AAN7 is grounded. The output terminal of the chip AAN7 is connected to the base of the triode AAQ4, the grounded resistor AAR38 and the grounded capacitor AAC66 through the resistor AAR36, respectively. The emitter of the triode AAQ4 is grounded. The collector of the triode AAQ4 is connected to the pin Vin of the chip AAN8, the grounded capacitors AAC62-AAC65, the grounded resistor AAR37 and one end of the resistor AAR34 through the resistor AAR35, respectively. The other end of the resistor AAR34 is connected to the grounded capacitor AAC58, the other end of the resistor AAR31 and the source of the MOS transistor AAQ1, respectively.

Figure 15:
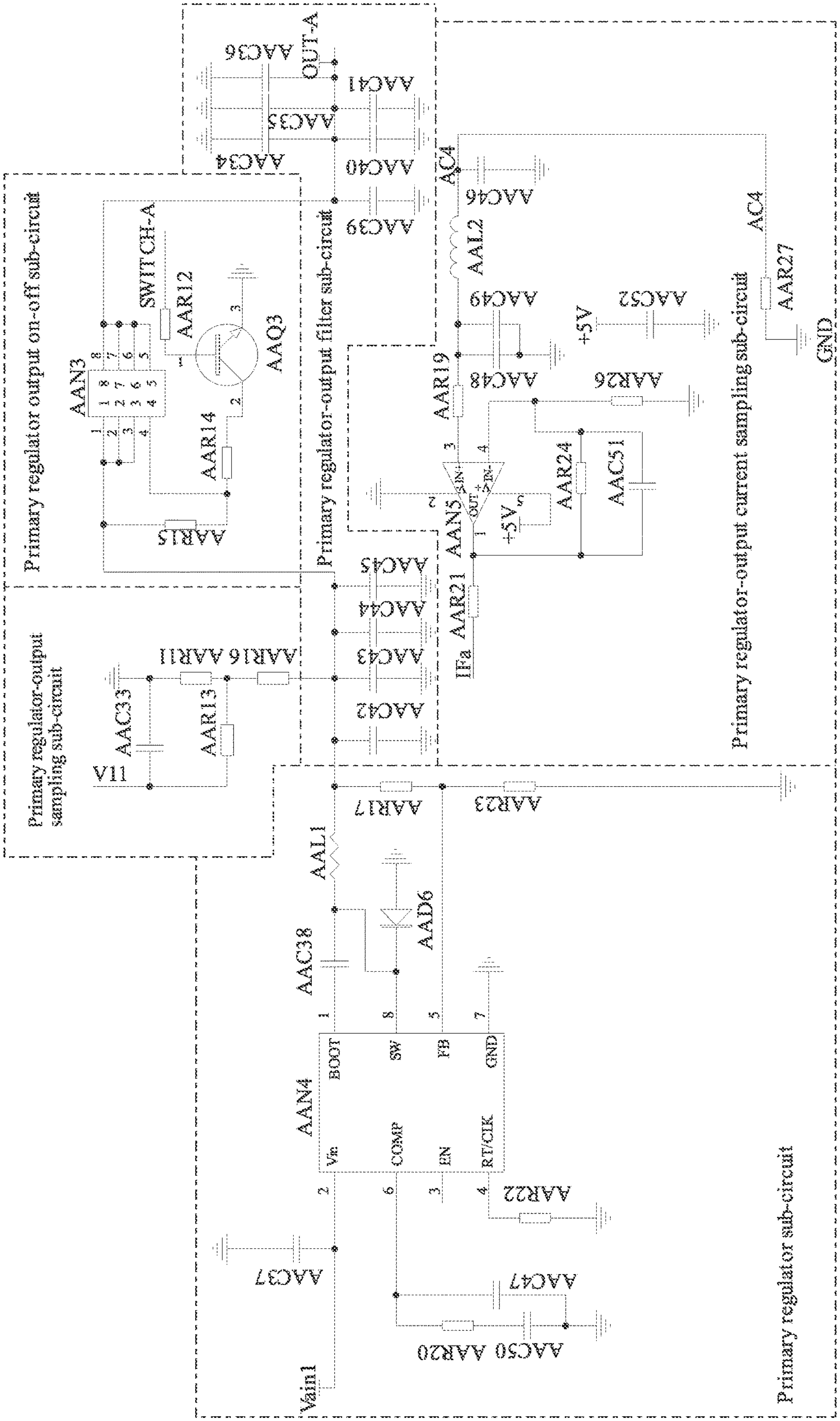
FIG. 15 shows a schematic diagram of a circuit structure of a primary regulator and filter module according to an embodiment of the present invention.

As shown in FIG. 15, the primary regulator and filter module includes a primary regulator sub-circuit, a primary regulator-output sampling sub-circuit, a primary regulator output on/off sub-circuit, a primary regulator-output filter sub-circuit, and a primary regulator-output current sampling sub-circuit.

The primary regulator sub-circuit includes the regulator chip AAN4. In an embodiment of the present invention, the model of the regulator chip AAN4 is TP54360. The pin Vin of the chip AAN4 is connected to the grounded capacitor AAC37 and the drain of the MOS transistor AAQ1, respectively. The pin COMP of the chip AAN4 is connected to the grounded capacitor AAC47 and one end of the resistor AAR20, respectively. The pin RT/CLK of the chip AAN4 is connected to the grounded resistor AAR22. The pin GND of the chip AAN4 is grounded. The pin FB of the chip AAN4 is connected to the grounded resistor AAR23 and one end of the resistor AAR17, respectively. The pin SW of the chip AAN4 is connected to the cathode of the diode AAD6, one end of the inductor AAL1 and one end of the capacitor AAC38, respectively. The pin BOOT of the chip AAN4 is connected to the other end of the capacitor AAC38. The other end of the resistor AAR20 is connected to the grounded capacitor AAC50. The other end of the inductor AAL1 is connected to the other end of the resistor AAR17.

The primary regulator-output sampling sub-circuit includes the resistor AAR16. One end of the resistor AAR16 is connected to the other end of the inductor AAL1, and the other end of the resistor AAR16 is connected to the grounded resistor AAR11 and one end of the resistor AAR13, respectively. The other end of the resistor AAR13 is connected to the grounded capacitor AAC33.

The primary regulator output on/off sub-circuit includes the triode chip AAN3. In an embodiment of the present invention, the model of the triode chip AAN3 is A04435. The 1$^{st}$ pin of the triode chip AAN3 is connected to the 2$^{nd}$ pin of the triode chip AAN3, the 3$^{rd}$ pin of the triode chip AAN3, one end of the resistor AAR15 and the other end of the inductor AAL1, respectively. The 4$^{th}$ pin of the triode chip AAN3 is connected to the other end of the resistor AAR15 and one end of the resistor AAR14, respectively. The 5$^{th}$ pin of the triode chip AAN3 is connected to the 6$^{th}$ pin, the 7$^{th}$ pin and the 8$^{th}$ pin of the triode chip AAN3, respectively. The other end of the resistor AAR14 is connected to the collector of the triode AAQ3. The emitter of the triode AAQ3 is grounded. The base of the triode AAQ3 is connected to one end of the resistor AAR12.

The primary regulator-output filter sub-circuit includes the grounded capacitors AAC34-AAC36 and the grounded capacitors AAC39-AAC45. The grounded capacitors AAC34-AAC36 and the grounded capacitors AAC39-AAC41 are all connected to the 8$^{th}$ pin of the chip AAN3. The grounded capacitors AAC42-AAC45 are all connected to the 1$^{st}$ pin of the chip AAN3.

The primary regulator-output current sampling sub-circuit includes the operational amplifier chip AAN5. In an embodiment of the present invention, the model of the operational amplifier chip AAN5 is GS8591. The non-inverting input terminal of the chip AAN5 is connected to one end of the inductor AAL2, the grounded capacitor AAC48 and the grounded capacitor AAC49 through the resistor AAR19, respectively. The inverting input terminal of the chip AAN5 is connected to one end of the resistor AAR24, one end of the capacitor AAC51 and the grounded resistor AAR26, respectively. The voltage terminal of the chip AAN5 is connected to the grounded capacitor AAC52 and the pin Vout of the chip AAN8, respectively. The grounded terminal of the chip AAN5 is grounded. The output terminal of the chip AAN5 is connected to the other end of the resistor AAR24, the other end of the capacitor AAC51 and one end of the resistor AAR21, respectively. The other end of the inductor AAL2 is connected to the grounded resistor AAR27 and the grounded capacitor AAC46, respectively.

Figure 16:
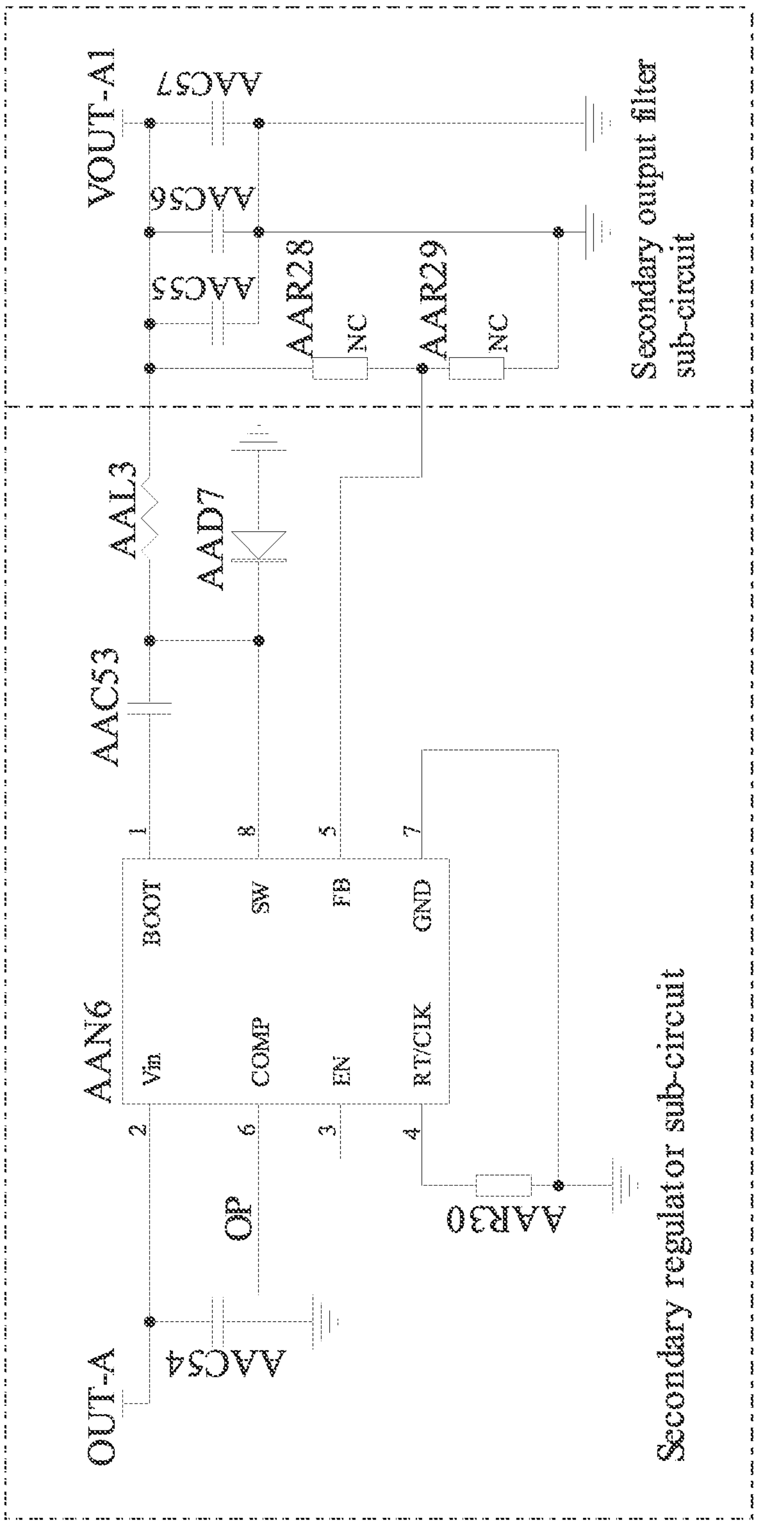
FIG. 16 shows a schematic diagram of a circuit structure of a secondary regulator and filter module according to an embodiment of the present invention.

As shown in FIG. 16, the secondary regulator and filter module includes a secondary regulator sub-circuit and a secondary output filter sub-circuit.

The secondary regulator sub-circuit includes the regulator chip AAN6. In an embodiment of the present invention, the model of the regulator chip AAN6 is TPS54360. The pin Vin of the chip AAN6 is connected to the grounded capacitor AAC54 and the 8$^{th}$ pin of the chip AAN3, respectively. The pin RT/CLK of the chip AAN6 is connected to the grounded resistor AAR30. The pin GND of the chip AAN6 is grounded. The pin FB of the chip AAN6 is connected to one end of the resistor AAR28 and the grounded resistor AAR29, respectively. The pin SW of the chip AAN6 is connected to one end of the inductor AAL3, one end of the capacitor AAC53 and the cathode of the diode AAD7, respectively. The pin BOOT of the chip AAN6 is connected to the other end of the capacitor AAC53. The anode of the diode AAD7 is grounded. The other end of the inductor AAL3 is connected to the other end of the resistor AAR28.

The secondary output filter sub-circuit includes the grounded capacitors AAC55-AAC57. The grounded capacitors AAC55-AAC57 are all connected to the other end of the inductor AAL3.

Figure 17:
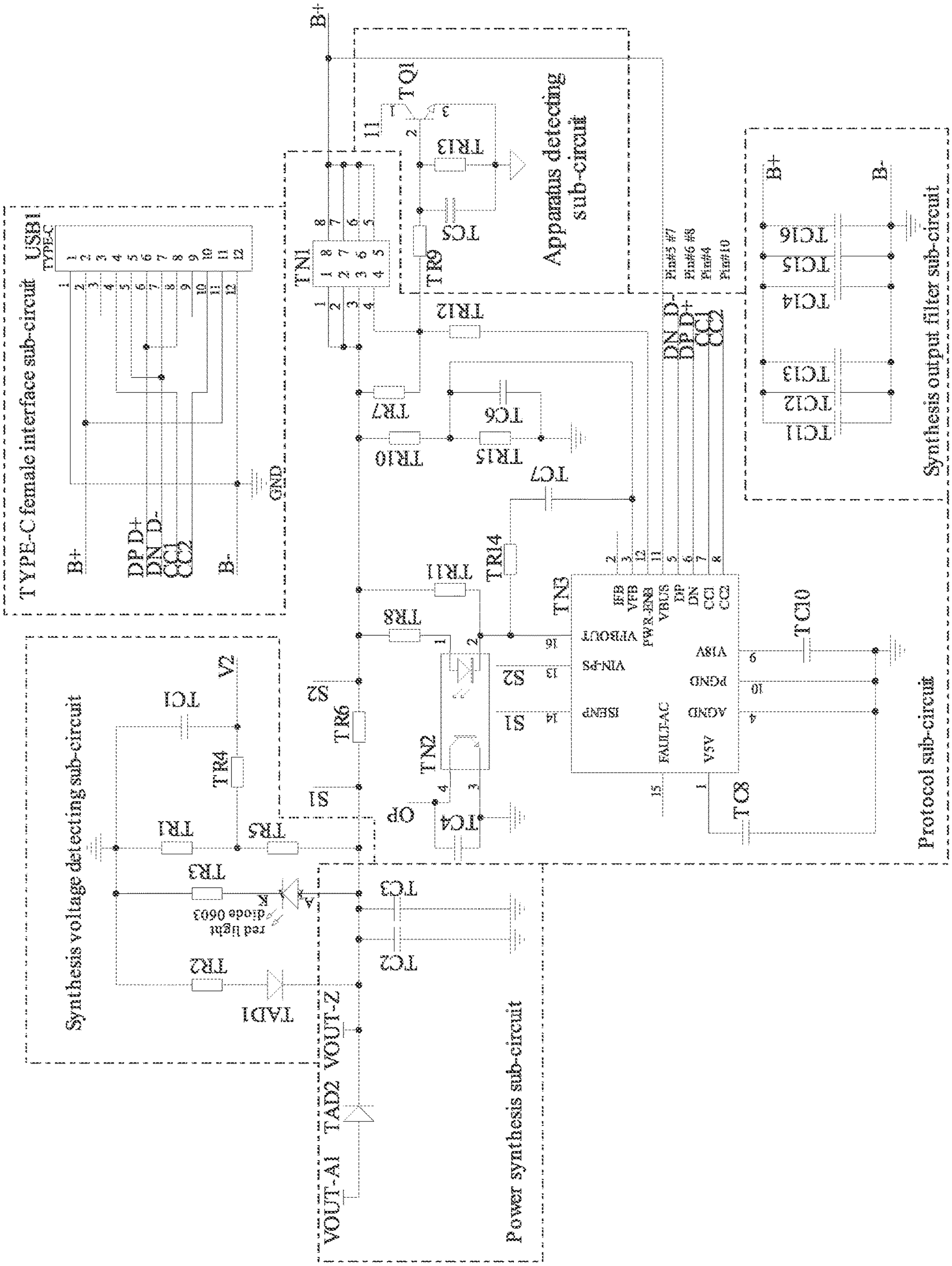
FIG. 17 shows a schematic diagram of a circuit structure of a power synthesis and protocol module according to an embodiment of the present invention.
Figure 18:
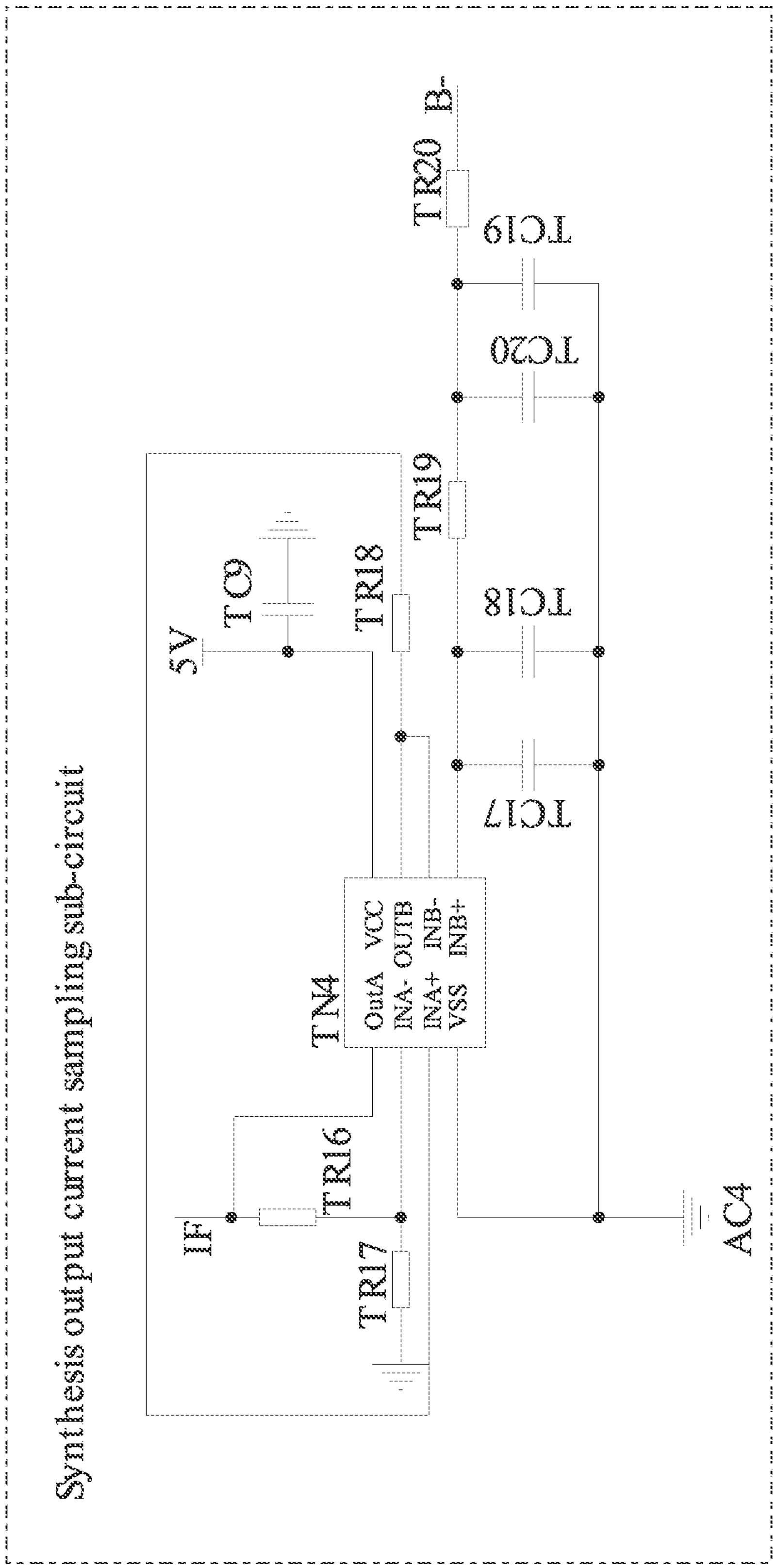
FIG. 18 shows a schematic diagram of a circuit structure of a synthesis output current sampling sub-circuit in the power synthesis and protocol module according to an embodiment of the present invention.

As shown in FIGS. 17-18, the power synthesis and protocol module includes a power synthesis sub-circuit, a synthesis voltage detecting sub-circuit, a TYPE-C female interface sub-circuit, a protocol sub-circuit, an apparatus detecting sub-circuit, a synthesis output filter sub-circuit, and a synthesis output current sampling sub-circuit.

The power synthesis sub-circuit includes the diode TAD2. The anode of the diode TAD2 is connected to the other end of the inductor AAL3. The cathode of the diode TAD2 is connected to the grounded capacitor TC2 and the grounded capacitor TC3, respectively.

The synthesis voltage detecting sub-circuit includes the diode TAD1. The cathode of the diode TAD1 is connected to the cathode of the diode TAD2, and the anode of the diode TAD1 is connected to one end of the resistor TR2. The other end of the resistor TR2 is connected to one end of the resistor TR1, one end of the resistor TR3 and one end of the capacitor TC1, respectively, and is grounded. The other end of the resistor TR1 is connected to one end of the resistor TR4 and one end of the resistor TR5, respectively. The other end of the capacitor TC1 is connected to the other end of the resistor TR4. The other end of the resistor TR3 is connected to the cathode of a red-light diode. The anode of the red-light diode is connected to the other end of the resistor TR5 and the cathode of the diode TAD2, respectively.

The TYPE-C female interface sub-circuit includes the universal serial bus (USB) interface chip USB1. The 1st pin of the chip USB1 is connected to the 12th pin of the chip USB1 and is grounded. The 2nd pin of the chip USB1 is connected to the 11th pin of the chip USB1. The 5th pin of the chip USB1 is connected to the 7th pin of the chip USB1. The 6th pin of the chip USB1 is connected to the 8th pin of the chip USB1.

The protocol sub-circuit includes the protocol chip TN3. In an embodiment of the present invention, the model of the protocol chip TN3 is CY2311. The pin V5V of the chip TN3 is connected to the grounded capacitor TC8. The pin AGND and the pin PGND of the chip TN3 are both grounded. The pin V18V of the chip TN3 is connected to the grounded capacitor TC10. The pin CC2 of the chip TN3 is connected to the 10th pin of the chip USB1. The pin CC1 of the chip TN3 is connected to the 4th pin of the chip USB1. The pin DN of the chip TN3 is connected to the 6th pin of the chip USB1. The pin DP of the chip TN3 is connected to the 5th pin of the chip USB1. The pin VBUS of the chip TN3 is connected to the 2nd pin of the chip USB1. The pin PWR-ENB of the chip TN3 is connected to one end of the resistor TR12. The pin VFB of the chip TN3 is connected to one end of the capacitor TC7, one end of the resistor TR10, the grounded resistor TR15 and the grounded capacitor TC6, respectively. The pin VFBOUT of the chip TN3 is connected to one end of the resistor TR11, one end of the resistor TR14 and the 2nd pin of the optical coupling chip TN2 e.g., model EL1018, respectively. The pin VIN-PS of the chip TN3 is connected to the other end of the resistor TR10, the other end of the resistor TR11, one end of the resistor TR6, one end of the resistor TR7, one end of the resistor TR8 and the 1st pin, the 2nd pin and the 3rd pin of the switching chip TN1, respectively. The pin ISENP of the chip TN3 is connected to the other end of the resistor TR6 and the cathode of the diode TAD2, respectively. The other end of the resistor TR14 is connected to the other end of the capacitor TC7. The 1st pin of the chip TN2 is connected to the other end of the resistor TR8. The 3rd pin of the chip TN2 is grounded. The 4th pin of the chip TN2 is connected to the grounded capacitor TC4 and the pin COMP of the chip AAN6, respectively. The 4th pin of the chip TN1 is connected to the other end of the resistor TR7 and the other end of the resistor TR12, respectively. The 5th pin, the 6th pin, the 7th pin and the 8th pin of the chip TN1 are all connected to the 2nd pin of the chip USB1.

The apparatus detecting sub-circuit includes the triode TQ1. The base of the triode TQ1 is connected to one end of the resistor TR9, the grounded resistor TR13 and the grounded capacitor TC5, respectively. The emitter of the triode TQ1 is grounded. The other end of the resistor TR9 is connected to the 4th pin of the chip TN1.

The synthesis output filter sub-circuit includes the capacitors TC11-TC16. One end of each of the capacitors TC11-TC16 is connected to the 2nd pin of the chip USB1. The other end of each of the capacitors TC11-TC16 is connected to the 1st pin of the chip USB1, and is grounded.

The synthesis output current sampling sub-circuit includes the current sampling chip TN4. In an embodiment of the present invention, the model of the current sampling chip TN4 is GS8592. The pin OUTA of the chip TN4 is connected to one end of the resistor TR16. The pin INA− of the chip TN4 is connected to the other end of the resistor TR16 and the grounded resistor TR17, respectively. The pin INA+ of the chip TN4 is connected to one end of the resistor TR18. The pin VSS of the chip TN4 is grounded. The pin INB+ of the chip TN4 is connected to the grounded capacitor TC17, the grounded capacitor TC18 and one end of the resistor TR19, respectively. The pin INB− and the pin OUTB of the chip TN4 are both connected to the other end of the resistor TR18. The pin VCC of the chip TN4 is connected to the grounded capacitor TC9 and the pin Vout of the chip AAN8, respectively. The other end of the resistor TR19 is connected to the grounded capacitor TC19, the grounded capacitor TC20 and one end of the resistor TR20, respectively. The other end of the resistor TR20 is connected to the 1st pin of the chip USB1.

Figure 19:
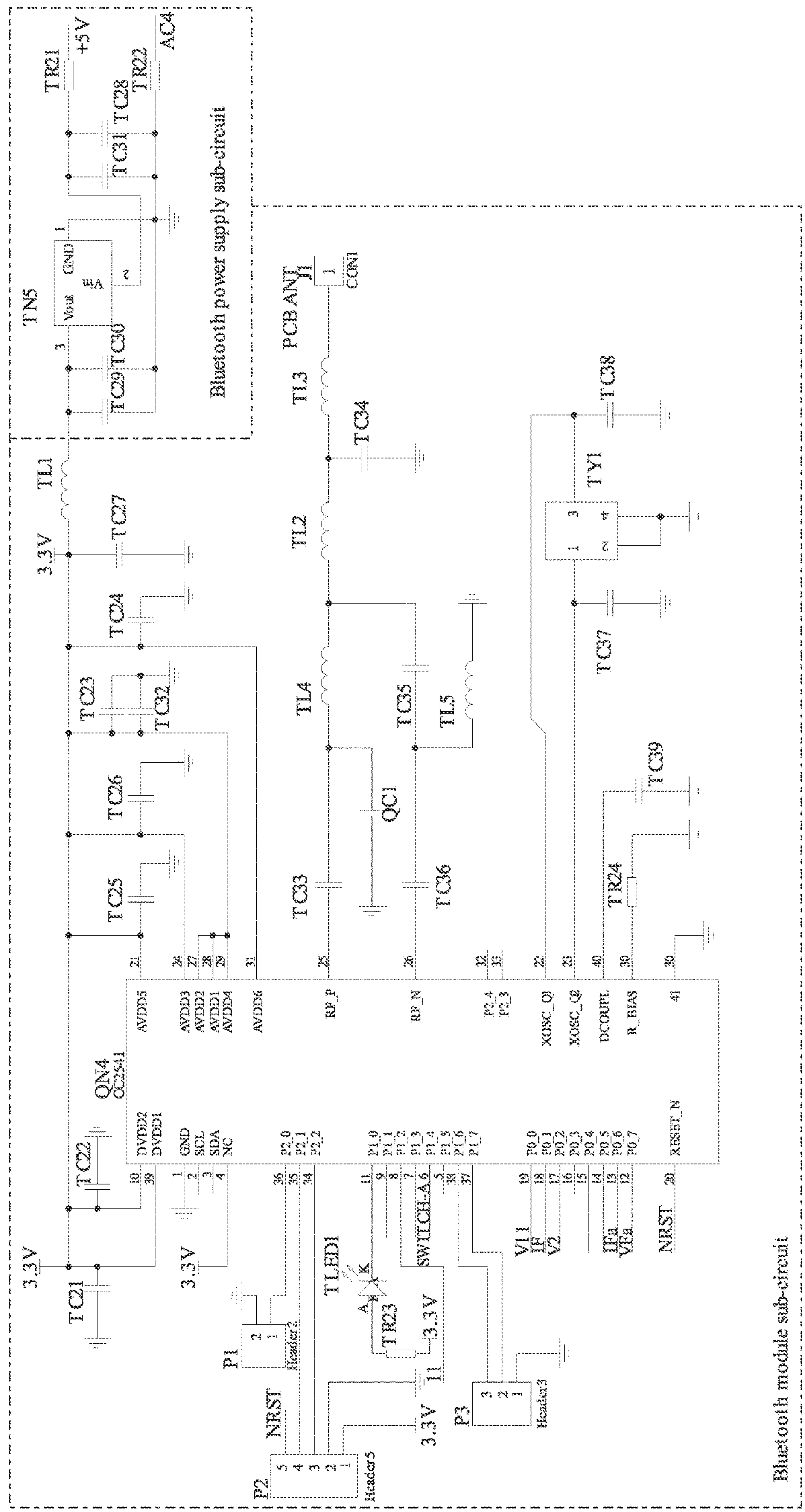
FIG. 19 shows a schematic diagram of a circuit structure of a receiving-end Bluetooth-communication and control module according to an embodiment of the present invention.

As shown in FIG. 19, the receiving-end Bluetooth-communication and control module includes a Bluetooth module sub-circuit and a Bluetooth power supply sub-circuit.

The Bluetooth module sub-circuit includes the single chip microcomputer chip QN4. In an embodiment of the present invention, the model of the single chip microcomputer chip QN4 is CC2541. The pin DVDD1 of the chip QN4 is connected to the pin DVDD2 of the chip QN4, the pins AVDD1-AVDD6 of the chip QN4, the grounded capacitors TC21-TC27, one end of the inductor TL1 and the 3.3V power source, respectively. The pin GND of the chip QN4 is grounded. The pin NC of the chip QN4 is connected to the 3.3V power source. The pin P2_0 of the chip QN4 is connected to the 1st pin of the connector P1. The 2nd pin of the connector P1 is grounded. The pin P2_1 of the chip QN4 is connected to the 4th pin of the connector P2. The pin P2_2 of the chip QN4 is connected to the 3rd pin of the connector P2. The 2nd pin of the connector P2 is grounded. The 1st pin of the connector P2 is connected to the 3.3V power source. The pin P1_0 of the chip QN4 is connected to the cathode of the light-emitting diode TLED 1. The anode of the light-emitting diode TLED 1 is connected to the 3.3V power source through the resistor TR23. The pin P1_2 of the chip QN4 is connected to the collector of the triode TQ1. The pin P1_4 of the chip QN4 is connected to the other end of the resistor AAR12. The pin P1_6 of the chip QN4 is connected to the 3rd pin of the connector P3. The pin P1_7 of the chip QN4 is connected to the 2nd pin of the connector P3. The 1st pin of the connector P3 is grounded. The pin P0_0 of the chip QN4 is connected to the other end of the resistor AAR13. The pin PO1 of the chip QN4 is connected to the pin OUTA of the chip TN4. The pin P0_2 of the chip QN4 is connected to the other end of the capacitor TC1. The pin P0_6 of the chip QN4 is connected to the other end of the resistor AAR21. The pin P0_7 of the chip QN4 is connected to the other end of the resistor AAR8. The pin RESET_N of the chip QN4 is connected to the 5th pin of the connector P2. The pin 41 of the chip QN4 is grounded. The pin R_BIAS of the chip QN4 is connected to the grounded resistor TR24. The pin DCOUPL of the chip QN4 is connected to the grounded capacitor TC39. The pin XOSC_Q2 of the chip QN4 is connected to the grounded capacitor TC37 and the 1st pin of the connector TY1, respectively. The pin XOSC_Q1 of the chip QN4 is connected to the grounded capacitor TC38 and the 3rd pin of the connector TY1, respectively. The 2nd pin and the 4th pin of the connector TY1 are grounded. The pin RF_N of the chip QN4 is connected to one end of the capacitor TC35 and the grounded inductor TL5 through the capacitor TC36, respectively. The pin RF_P of the chip QN4 is connected to one end of the inductor TL4 and the grounded capacitor QC1 through the capacitor TC33, respectively. The other end of the capacitor TC35 is connected to the other end of the inductor TL4 and one end of the inductor TL2, respectively. The other end of the inductor TL2 is connected to one end of the inductor TL3 and the grounded capacitor TC34, respectively. The other end of the inductor TL3 is connected to the antenna PCBANT.

The Bluetooth power supply sub-circuit includes the regulator chip TN5. In an embodiment of the present invention, the model of the regulator chip TN5 is HT7333-1. The pin Vout of the chip TN5 is connected to the grounded capacitor TC29, the grounded capacitor TC30 and the other end of the inductor TL1, respectively. The pin Vin of the chip TN5 is connected to the grounded capacitor TC28, the grounded capacitor TC31 and one end of the resistor TR21, respectively. The other end of the resistor TR21 is connected to the pin Vout of the chip AAN8. The pin GND of the chip TN5 is connected to one end of the resistor TR22, and is grounded. The other end of the resistor TR22 is connected to the other end of the inductor AAL2.

In an embodiment of the present invention, the output power of the multi-transmitting multi-receiving magnetic-resonance wireless charging system is set to be 30 W. The 6.78 mHz excitation signal is amplified by the radio-frequency power amplifier source and is added to the magnetic-resonance transmitting antenna, the energy is then transmitted to the magnetic-resonance receiving antenna in a magnetic resonance coupling manner. Electromagnetic energy received by the magnetic-resonance receiving antenna is rectified and filtered to enter the two-stage regulator circuit for voltage regulation, and then to output. The magnetic-resonance transmitting antennas correspond to the magnetic-resonance receiving antennas one by one. Each magnetic-resonance receiving antenna uniformly receives the electromagnetic energy of the corresponding magnetic-resonance transmitting antenna. The electromagnetic energy is output from a resonance coil of the magnetic-resonance receiving antenna and is then input into the corresponding rectifier and filter module. The electromagnetic energy is input into a rectifier module through a port of the matching network and is converted into a direct-current electric energy after passing through a bridge rectifier circuit. After the direct-current electric energy passes through a filter circuit, a direct-current electric energy of 23V is output through the regulator chip and a regulator peripheral circuit. After the direct-current electric energy of 23 V passes through the regulator chip controlled by the protocol chip, the voltage of the direct-current electric energy is stabilized at 20V Finally, the direct-current electric energy is synthesized into one-channel direct-current electric energy by means of power synthesis to be output to consumer electronic products, communication apparatuses and notebooks for use.

With the present invention, voltage and current stresses on electronic components in each single channel may be reduced under the condition of providing larger power, thereby reducing the components in weight and size to enable a whole transmitting and receiving module to have a height not more than lcm. Under a multi-transmitting multi-receiving condition, a magnetic field is distributed uniformly, which may effectively improve a coupling distance, increase a degree of freedom in horizontal direction, and improve a transmission efficiency, with a highest efficiency more than 90%.

The multi-transmitting multi-receiving magnetic-resonance wireless charging system according to the present invention may realize wireless power transmission with the transmission distance of 10-40 mm, the transmission efficiency of more than 85%, the DC-DC energy conversion efficiency of more than 60% and the transmission power of not less than 40 W. Within an effective charging range, the transmission efficiency is kept stable along with transverse movement of the receiving end.

It will be appreciated by those skilled in the art that the embodiments described herein are intended to assist the reader in understanding the principles of the present invention and do not construct a limitation to the scope of protection of the present invention. Any modification and combination made by those skilled in the art without departing from the essence of the present invention shall fall within the scope of protection of the present invention.

What is claimed is:

1. A multi-transmitting multi-receiving magnetic-resonance wireless charging system for a medium-power electronic apparatus, comprising a magnetic-resonance transmitting module and a magnetic-resonance receiving module; wherein the magnetic-resonance transmitting module comprises a transmitting-end Bluetooth-communication and control module and at least two magnetic-resonance transmitting channels; wherein each magnetic-resonance transmitting channel of the at least two magnetic-resonance transmitting channels comprises a DC/DC regulator module, a radio-frequency power amplifier source, a matching network and a magnetic-resonance transmitting antenna;

the DC/DC regulator module, the radio-frequency power amplifier source, the matching network and the magnetic-resonance transmitting antenna are connected sequentially;

the DC/DC regulator module is electrically connected to the transmitting-end Bluetooth-communication and control module and an external adapter;

the matching network is connected to the transmitting-end Bluetooth-communication and control module; and the magnetic-resonance receiving module comprises a receiving-end Bluetooth-communication and control module, a power synthesis and protocol module and at least two magnetic-resonance receiving channels; wherein each magnetic-resonance receiving channel of the at least two magnetic-resonance receiving channels comprises a magnetic-resonance receiving antenna, a receiving-antenna matching network, a rectifier and filter module, a primary regulator and filter module and a secondary regulator and filter module;

the magnetic-resonance receiving antenna, the receiving-antenna matching network, the rectifier and filter module, the primary regulator and filter module and the secondary regulator and filter module are connected sequentially;

the magnetic-resonance transmitting antenna is coupled with the magnetic-resonance receiving antenna in one-to-one correspondence;

the rectifier and filter module is connected to the receiving-end Bluetooth-communication and control module;

the receiving-end Bluetooth-communication and control module is in wireless communication with the transmitting-end Bluetooth-communication and control module;

an output end of the secondary regulator and filter module is connected to an input end of the power synthesis and protocol module, and an output end of the power synthesis and protocol module is electrically connected to an external charging apparatus.

2. The multi-transmitting multi-receiving magnetic-resonance wireless charging system according to claim 1, wherein the DC/DC regulator module comprises an input filter sub-circuit, a regulator sub-circuit, a voltage control sub-circuit, an output filter sub-circuit and a regulator output on/off sub-circuit; wherein the input filter sub-circuit comprises a polar capacitor AC8, a polar capacitor AC9 and an inductor AL1; wherein a first end of the inductor AL1 is connected to an anode of the polar capacitor AC8, and a second end of the inductor AL1 is connected to an anode of the polar capacitor AC9 to form a Pi-type filter structure;

a cathode of the polar capacitor AC8 and a cathode of the polar capacitor AC9 are grounded;

a connection node of the inductor AL1 and the polar capacitor AC9 is connected to a +18V supply voltage provided by the external adapter;

the regulator sub-circuit comprises a regulator chip AN1; wherein a pin Vin of the regulator chip AN1 is connected to a grounded capacitor AC1, a first end of a resistor AR1 and the anode of the polar capacitor AC8, respectively;

a pin COMP of the regulator chip AN1 is connected to a grounded capacitor AC11 and a first end of a resistor AR5, respectively; a second end of the resistor AR5 is connected to a grounded capacitor AC10;

a pin EN of the regulator chip AN1 is connected to a second end of the resistor AR1 and a grounded resistor ARB, respectively;

a pin RT/CLK of the regulator chip AN1 is connected to a grounded resistor AR11;

a pin GND of the regulator chip AN1 is grounded;

a pin FB of the regulator chip AN1 is connected to a first end of a resistor AR6; a second end of the resistor AR6 is connected to a first end of a resistor AR4, a first end of a resistor AR7 and a cathode of a diode AD2, respectively;

a pin SW of the regulator chip AN1 is connected to a cathode of a diode AD1, a first end of a capacitor AC4 and a first end of an inductor AL2, respectively;

an anode of the diode AD1 is grounded; a second end of the capacitor AC4 is connected to a pin BOOT of the regulator chip AN1;

the voltage control sub-circuit comprises a triode AN4 and a triode AN5; wherein a collector of the triode AN4 is connected to a second end of the resistor AR7 and a first end of a resistor AR12, respectively;

a base of the triode AN4 is connected to a first end of a resistor AR13 and a grounded resistor AR14, respectively;

an emitter of the triode AN4 is grounded;

a collector of the triode AN5 is connected to a second end of the resistor AR12 and a grounded resistor AR15, respectively;

a base of the triode AN5 is connected to a first end of a resistor AR16 and a grounded resistor AR17, respectively;

an emitter of the triode AN5 is grounded;

the output filter sub-circuit comprises polar a capacitor AC2, a capacitor AC3, a grounded capacitor AC6 and a grounded capacitor AC7; wherein an anode of the polar capacitor AC2 is connected to an anode of the polar capacitor AC3, the grounded capacitor AC6, the grounded capacitor AC7, a second end of the resistor AR4 and a second end of the inductor AL2, respectively;

a cathode of the polar capacitor AC2 and a cathode of the polar capacitor AC3 are grounded; and the regulator output on/off sub-circuit comprises an MOS transistor AN2 and a triode AN3; wherein a source of the MOS transistor AN2 is connected to a first end of a resistor AR2 and the second end of the inductor AL2, respectively;

a gate of the MOS transistor AN2 is connected to a second end of the resistor AR2 and a first end of a resistor AR3, respectively;

a drain of the MOS transistor AN2 is connected to an anode of a polar capacitor AC5;

a collector of the triode AN3 is connected to a second end of the resistor AR3;

a base of the triode AN3 is connected to a first end of a resistor AR9 and a grounded resistor AR10, respectively;

an emitter of the triode AN3 is connected to a cathode of the polar capacitor AC5 and a first end of a resistor RSA1, respectively, and the emitter of the triode AN3, the cathode of the polar capacitor AC5 and the first end of the resistor RSA1 are grounded;

the radio-frequency power amplifier source comprises a current-limiting sub-circuit, an output current sampling sub-circuit and an operational amplifier power supply sub-circuit; wherein, an operational amplifier chip AN6 is shared by the current-limiting sub-circuit and the output current sampling sub-circuit; wherein a pin VDD of the operational amplifier chip AN6 is connected to a grounded capacitor AC12 and a grounded capacitor AC13, respectively;

a pin OUTB of the operational amplifier chip AN6 is connected to a first end of a resistor AR22;

a pin INB− of the operational amplifier chip AN6 is connected to a second end of the resistor AR22 and a grounded resistor AR20, respectively;

a pin INB+ of the operational amplifier chip AN6 is connected to a first end of a resistor AR23;

a second end of the resistor AR23 is connected to a first end of an resistor AL6 and a grounded capacitor AC22, respectively;

a second end of the resistor AL6 is connected to a grounded capacitor AC20, a grounded capacitor AC21 and a second end of the resistor RSA1, respectively;

a pin OUTA of the operational amplifier chip AN6 is connected to a first end of a resistor AR19 and an anode of the diode AD2, respectively;

a pin INA− of the operational amplifier chip AN6 is connected to a second end of the resistor AR19 and a grounded resistor AR18, respectively;

a pin INA+ of the operational amplifier chip AN6 is connected to a first end of a resistor AR21;

a second end of the resistor AR21 is connected to a first end of an resistor AL4 and a grounded capacitor AC19, respectively;

a second end of the resistor AL4 is connected to a grounded capacitor AC17, a grounded capacitor AC 18 and the second end of the resistor RSA1, respectively;

a pin VSS of the operational amplifier chip AN6 is grounded;

the operational amplifier power supply sub-circuit comprises a regulator chip N2; wherein a pin GND of the regulator chip N2 is grounded;

a pin Vin of the regulator chip N2 is connected to a grounded capacitor AC16 and the drain of the MOS transistor AN2, respectively;

a pin Vout of the regulator chip N2 is connected to a grounded capacitor AC15 and the pin VDD of the operational amplifier chip AN6, respectively;

the matching network comprises a drain bias sub-circuit, a gate bias sub-circuit, an output matching sub-circuit, a transmitting-antenna matching network sub-circuit and a transmitting-antenna matching network switching sub-circuit; wherein, the drain bias sub-circuit comprises an inductor AL8; wherein a first end of the inductor AL8 is connected to an anode of a polar capacitor AC36, an anode of a polar capacitor AC37, a first end of a capacitor AC39, a first end of a capacitor AC40 and the pin Vin of the regulator chip N2, respectively;

a second end of the inductor AL8 is connected to a first end of a capacitor AC32, a first end of a capacitor AC33 and a first end of a capacitor AC34, respectively;

a cathode of the polar capacitor AC36, a cathode of the polar capacitor AC37, a second end of the capacitor AC39, a second end of the capacitor AC40, a second end of the capacitor AC32, a second end of the capacitor AC33 and a second end of the capacitor AC34 are connected to an electromagnetic energy input port AV− of the magnetic-resonance transmitting antenna;

the gate bias sub-circuit comprises a regulator chip AN7; wherein a pin Vin of the regulator chip AN7 is connected to a first end of a capacitor AC52 and the pin Vin of the regulator chip N2, respectively;

a pin GND of the regulator chip AN7 is connected to a second end of the capacitor AC52, a first end of a capacitor AC53, the second end of the resistor RSA1 and the electromagnetic energy input port AV− of the magnetic-resonance transmitting antenna, respectively;

a pin Vout of the regulator chip AN7 is connected to a second end of the capacitor AC53, a first end of a capacitor AC55, a first end of a resistor AR27 and a first end of an inductor AL9, respectively;

a second end of the inductor AL9 is connected to a first end of a capacitor AC49, a first end of a capacitor AC50 and a 4$^{th}$ pin of a connector AY1, respectively;

a 3$^{rd}$ pin of the connector AY1 is connected to a first end of a capacitor AC45 and a first end of a capacitor AC51, respectively;

a second end of the resistor AR27 is connected to a first end of a capacitor AC56, a first end of a resistor AR24 and a first end of a resistor AR29 through a resistor AR28, respectively;

a second end of the resistor AR24 is connected to a second end of the capacitor AC45, a second end of the capacitor AC51 and a gate of an MOS transistor AN8, respectively;

a drain of the MOS transistor AN8 is connected to the second end of the inductor ALB;

a source of the MOS transistor AN8, a 2$^{nd}$ pin of the connector AY1, a second end of the capacitor AC49, a second end of the capacitor AC50, a second end of the capacitor AC55, a second end of the capacitor AC56 and a second end of the resistor AR29 are connected to the electromagnetic energy input port AV− of the magnetic-resonance transmitting antenna;

the output matching sub-circuit comprises an inductor AL7; wherein a first end of the inductor AL7 is connected to a first end of a capacitor AC35, a first end of a capacitor AC41, a first end of a capacitor AC43 and a first end of a capacitor AC44, respectively;

a second end of the inductor AL7 is connected to a second end of the capacitor AC41, a second end of the capacitor AC44, a first end of a capacitor AC46, a first end of a capacitor AC47 and a first end of a capacitor AC48, respectively;

a second end of the capacitor AC35 and a second end of the capacitor AC43 are connected to the second end of the inductor AL8;

a second end of the capacitor AC46, a second end of the capacitor AC47 and a second end of the capacitor AC48 are connected to the electromagnetic energy input port AV− of the magnetic-resonance transmitting antenna;

the transmitting-antenna matching network switching sub-circuit comprises a triode AN9; wherein a collector of the triode AN9 is connected to a cathode of a diode AD5 and a second control port of a switch AK1, respectively;

a base of the triode AN9 is connected to a first end of a resistor AR26, a first end of a capacitor AC54 and a first end of a resistor AR25, respectively;

an emitter of the triode AN9 is connected to an anode of the diode AD5, a second end of the resistor AR26 and a second end of the capacitor AC54, respectively, and the emitter of the triode AN9, the anode of the diode AD5, the second end of the resistor AR26 and the second end of the capacitor AC54 are grounded;

a second end of the resistor AR25 is connected to a first end of a switch KA1 and a cathode of a diode AD4, respectively;

a second end of the switch KA1 is connected to a first end of a resistor R2;

a first movable contact of the switch AK1 is connected to the second end of the inductor AL7 through a capacitor AC38, and a second movable contact of the switch AK1 is connected to an electromagnetic energy input port AV+ of the magnetic-resonance transmitting antenna; and the transmitting-antenna matching network sub-circuit comprises a capacitor AC23, a capacitor AC24, a capacitor AC25, a capacitor AC26, a capacitor AC27, a capacitor AC28, a capacitor AC29, a capacitor AC30, a capacitor, AC31 and a capacitor AC42; wherein a first fixed contact of the switch AK1 is connected to a first end of the capacitor AC23, a first end of the capacitor AC28 and a first end of the capacitor AC31, respectively;

a second fixed contact of the switch AK1 is connected to a first end of the capacitor AC24, a first end of the capacitor AC27 and a first end of the capacitor AC42, respectively;

a third fixed contact of the switch AK1 is connected to a second end of the capacitor AC23, a second end of the capacitor AC28, a second end of the capacitor AC31, a first end of the capacitor AC25 and a first end of the capacitor AC26, respectively;

a fourth fixed contact of the switch AK1 is connected to a second end of the capacitor AC24, a second end of the capacitor AC27, a second end of the capacitor AC42, a first end of the capacitor AC29 and a first end of the capacitor AC30, respectively;

a second end of the capacitor AC25, a second end of the capacitor AC26, a second end of the capacitor AC29 and a second end of the capacitor AC30 are connected to the electromagnetic energy input port AV− of the magnetic-resonance transmitting antenna.

3. The multi-transmitting multi-receiving magnetic-resonance wireless charging system according to claim 2, wherein, the transmitting-end Bluetooth-communication and control module comprises a Bluetooth-communication control sub-circuit and a Bluetooth power supply sub-circuit; wherein, the Bluetooth-communication control sub-circuit comprises a single chip microcomputer chip N4; wherein a pin DVDD2 of the single chip microcomputer chip N4 is connected to a 3.3V power source and a grounded capacitor C8, respectively;

a pin DVDD1 of the single chip microcomputer chip N4 is connected to the 3.3V power source and a grounded capacitor C7, respectively;

a pin NC of the single chip microcomputer chip N4 is connected to the 3.3V power source;

a pin P1_3 of the single chip microcomputer chip N4 is connected to a second end of the resistor AR16;

a pin P1_4 of the single chip microcomputer chip N4 is connected to a second end of the resistor AR13;

a pin P1_5 of the single chip microcomputer chip N4 is connected to a second end of the resistor AR9;

a pin P1_6 of the single chip microcomputer chip N4 is connected to an anode of the diode AD4;

a pin P0_0 of the single chip microcomputer chip N4 is connected to the pin OUTB of the operational amplifier chip AN6;

a pin GND and a pin 41 of the single chip microcomputer chip N4 are grounded;

a pin R_BIAS of the single chip microcomputer chip N4 is connected to a grounded resistor R3;

a pin DCOUPL of the single chip microcomputer chip N4 is connected to a grounded capacitor C20;

a pin XOSC_Q2 of the single chip microcomputer chip N4 is connected to a grounded capacitor C18 and a 1$^{st}$ pin of a connector Y1, respectively;

a pin XOSC_Q1 of the single chip microcomputer chip N4 is connected to a grounded capacitor C19 and a 3$^{rd}$ pin of the connector Y1, respectively;

2$^{nd}$ pin and 4$^{th}$ pin of the connector Y1 are grounded;

a pin RF_N of the single chip microcomputer chip N4 is connected to a grounded capacitor C17 and a first end of an inductor L5 through a capacitor C16;

a pin RF_P of the single chip microcomputer chip N4 is connected to a grounded inductor L4 and a first end of a capacitor C13 through a capacitor C14;

a second end of the capacitor C13 is connected to a second end of the inductor L5 and a first end of an inductor L2, respectively;

a second end of the inductor L2 is connected to a first end of an inductor L3 and a grounded capacitor C15, respectively; a second end of the inductor L3 is connected to an antenna PCBANT;

a pin AVDD1 of the single chip microcomputer chip N4 is connected to a pin AVDD2 of the single chip microcomputer chip N4, a pin AVDD3 of the single chip microcomputer chip N4, a pin AVDD4 of the single chip microcomputer chip N4, a pin AVDD6 of the single chip microcomputer chip N4, a grounded capacitor C2, a grounded capacitor C3, a grounded capacitor C4, a grounded capacitor C9, a grounded capacitor C12, a first end of an inductor L 1 and the 3.3V power source, respectively;

a pin AVDD5 of the single chip microcomputer chip N4 is connected to a grounded capacitor C1 and the 3.3V power source, respectively; and the Bluetooth power supply sub-circuit comprises a regulator chip N3 and a regulator chip N5; wherein a pin Vin of the regulator chip N3 is connected to a grounded capacitor C5 and the +18V supply voltage provided by the external adapter, respectively;

a pin GND of the regulator chip N3 is connected to a grounded resistor RS1;

a pin Vout of the regulator chip N3 is connected to a grounded capacitor C6, a second end of the resistor R2 and a first control port of the switch AK1, respectively;

a pin Vout of the regulator chip N5 is connected to a grounded capacitor C10 and a second end of the inductor L1, respectively, and serves as a power supply terminal VCC of the Bluetooth power supply sub-circuit;

a pin GND of the regulator chip N5 is grounded;

a pin Vin of the regulator chip N5 is connected to a grounded capacitor C11, the second end of the resistor R2 and the first control port of the switch AK1, respectively.

4. The multi-transmitting multi-receiving magnetic-resonance wireless charging system according to claim 1, wherein the magnetic-resonance transmitting antenna comprises a first transmitting-antenna dielectric substrate, a second transmitting-antenna dielectric substrate and a third transmitting-antenna dielectric substrate, wherein the first transmitting-antenna dielectric substrate, the second transmitting-antenna dielectric substrate and the third transmitting-antenna dielectric substrate are provided from top to bottom in sequence;

a first transmitting resonant antenna and a second transmitting resonant antenna are printed at opposite corners of a top surface of the first transmitting-antenna dielectric substrate; each of the first transmitting resonant antenna and the second transmitting resonant antenna is configured as a first rectangular helical antenna with a first notch; wherein a first connection point is provided at an internal notch endpoint of the first transmitting resonant antenna and an external notch endpoint of the first transmitting resonant antenna, respectively; the external notch endpoint of the first transmitting resonant antenna is connected to a first end of a first right-angle microstrip line through the first connection point; a second end of the first right-angle microstrip line is connected to a first end of a first straight-line microstrip line through a first electromagnetic energy input port;

a second connection point is provided at a second end of the first straight-line microstrip line;

a third connection point is provided at an internal notch endpoint of the second transmitting resonant antenna and an external notch endpoint of the second transmitting resonant antenna, respectively; the external notch endpoint of the second transmitting resonant antenna is connected to a first end of a second right-angle microstrip line through the third connection point; a second end of the second right-angle microstrip line is connected to a first end of a second straight-line microstrip line through a second electromagnetic energy input port, and a fourth connection point is provided at a second end of the second straight-line microstrip line;

a third transmitting resonant antenna and a fourth transmitting resonant antenna are printed at opposite corners of a top surface of the second transmitting-antenna dielectric substrate; each of the third transmitting resonant antenna and the fourth transmitting resonant antenna is configured as a second rectangular helical antenna with a second notch; wherein a fifth connection point is provided at an internal notch endpoint of the third transmitting resonant antenna and an external notch endpoint of the third transmitting resonant antenna, respectively, and the fifth connection point is connected to the first connection point through a first through hole;

a sixth connection point is provided at an internal notch endpoint of the fourth transmitting resonant antenna and an external notch endpoint of the fourth transmitting resonant antenna, respectively, and the sixth connection point is connected to the third connection point through a second through hole;

a first microstrip line and a second microstrip line are printed at a bottom surface of the third transmitting-antenna dielectric substrate; wherein a seventh connection point and an eighth connection point are provided at both ends of the first microstrip line, respectively; the seventh connection point is connected to the second connection point through a third through hole; the eighth connection point is connected to the first connection point and the fifth connection point through a fourth through hole, respectively;

a ninth connection point and a tenth connection point are provided at both ends of the second microstrip line, respectively; the ninth connection point is connected to the fourth connection point through a fifth through hole; the tenth connection point is connected to the third connection point and the sixth connection point through a sixth through hole, respectively;

a corner of each of the first transmitting resonant antenna, the second transmitting resonant antenna, the third transmitting resonant antenna and the fourth transmitting resonant antenna is shaped as a smooth circular arc structure;

geometric and electrical parameters of the magnetic-resonance transmitting antenna are set as follows:

an external length $L_{res\_Tx}$ of the magnetic-resonance transmitting antenna is 10-800 mm;

an external width $H_{res\_Tx}$ of the magnetic-resonance transmitting antenna is 10-800 mm;

each of a length $L_{res\_Tx1}$ of the first transmitting resonant antenna, a length $L_{res\_Tx2}$ of the second transmitting resonant antenna, a length $L_{res\_Tx3}$ of the third transmitting resonant antenna and a length $L_{res\_Tx4}$ of the fourth transmitting resonant antenna is 5-400 mm;

each of a width $H_{res\_Tx1}$ of the first transmitting resonant antenna, a width $H_{res\_Tx2}$ of the second transmitting resonant antenna, a width $H_{res\_Tx3}$ of the third transmitting resonant antenna and a width $H_{res\_Tx4}$ of the fourth transmitting resonant antenna is 5-400 mm;

each of a width $W_{res\_Tx1}$ of microstrip lines in the first transmitting resonant antenna, a width $W_{res\_Tx2}$ of microstrip lines in the second transmitting resonant antenna, a width $W_{res\_Tx3}$ of microstrip lines in the third transmitting resonant antenna, a width $W_{res\_Tx4}$ of microstrip lines in the fourth transmitting resonant antenna, a width $W_{res\_Tx5}$ of the first microstrip line and a width $W_{res\_Tx6}$ of the second microstrip line is 1-6 mm;

each of a distance $S_{res\_Tx1}$ between the microstrip lines in the first transmitting resonant antenna, a distance $S_{res\_Tx2}$ between the microstrip lines in the second transmitting resonant antenna, a distance $S_{res\_Tx3}$ between the microstrip lines in the third transmitting resonant antenna and a distance $S_{res\_Tx4}$ between the microstrip lines in the fourth transmitting resonant antenna is 0.5-2 mm; and a transmitting resonant capacitance value of the magnetic-resonance transmitting antenna is 600 pF.

5. The multi-transmitting multi-receiving magnetic-resonance wireless charging system according to claim 1, wherein the magnetic-resonance receiving antenna comprises a first receiving-antenna dielectric substrate, a second receiving-antenna dielectric substrate and a third receiving-antenna dielectric substrate, wherein the first receiving-antenna dielectric substrate, the second receiving-antenna dielectric substrate and the third receiving-antenna dielectric substrate are provided from top to bottom in sequence;

a first receiving resonant antenna and a second receiving resonant antenna are printed at opposite corners of a top surface of the first receiving-antenna dielectric substrate; each of the first receiving resonant antenna and the second receiving resonant antenna is configured as a third rectangular helical antenna with a third notch; wherein an eleventh connection point is provided at an internal notch endpoint of the first receiving resonant antenna, and a twelfth connection point is provided at an external notch endpoint of the first receiving resonant antenna; the external notch endpoint of the first receiving resonant antenna is connected to a first end of a third right-angle microstrip line through the twelfth connection point; a second end of the third right-angle microstrip line is connected to a first end of a third straight-line microstrip line through a first electromagnetic energy output port;

a thirteenth connection point is provided at a second end of the third straight-line microstrip line;

a fourteenth connection point is provided at an internal notch endpoint of the second receiving resonant antenna, and a fifteenth connection point is provided at an external notch endpoint of the second receiving resonant antenna; the external notch endpoint of the second receiving resonant antenna is connected to a first end of a fourth right-angle microstrip line through the fifteenth connection point; a second end of the fourth right-angle microstrip line is connected to a first end of a fourth straight-line microstrip line through a second electromagnetic energy output port;

a sixteenth connection point is provided at a second end of the fourth straight-line microstrip line;

a third receiving resonant antenna and a fourth receiving resonant antenna are printed at opposite corners of a top surface of the second receiving-antenna dielectric substrate; each of the third receiving resonant antenna and the fourth receiving resonant antenna is configured as a fourth rectangular helical antenna with a fourth notch; wherein a seventeenth connection point is provided at an internal notch endpoint of the third receiving resonant antenna, and an eighteenth connection point is provided at an external notch endpoint of the third receiving resonant antenna; the seventeenth connection point is connected to the eleventh connection point through a seventh through hole, and the eighteenth connection point is connected to the twelfth connection point through an eighth through hole;

a nineteenth connection point is provided at an internal notch endpoint of the fourth receiving resonant antenna, and a twentieth connection point is provided at an external notch endpoint of the fourth receiving resonant antenna; the nineteenth connection point is connected to the fourteenth connection point through a ninth through hole, and the twentieth connection point is connected to the fifteenth connection point through a tenth through hole;

a third microstrip line and a fourth microstrip line are printed at a bottom surface of the third receiving-antenna dielectric substrate; wherein a twenty-first connection point and a twenty-second connection point are provided at both ends of the third microstrip line, respectively; the twenty-first connection point is connected to the seventeenth connection point and the eleventh connection point through an eleventh through hole, respectively; the twenty-second connection point is connected to the thirteenth connection point through a twelfth through hole;

a twenty-third connection point and a twenty-fourth connection point are provided at both ends of the fourth microstrip line, respectively; the twenty-third connection point is connected to the nineteenth connection point and the fourteenth connection point through a thirteenth through hole, respectively;

the twenty-fourth connection point is connected to the sixteenth connection point through a fourteenth through hole;

a corner of each of the first receiving resonant antenna, the second receiving resonant antenna, the third receiving resonant antenna and the fourth receiving resonant antenna is shaped as a smooth circular arc structure;

geometric and electrical parameters of the magnetic-resonance receiving antenna are set as follows:

an external length $L_{res\_Rx}$ of the magnetic-resonance receiving antenna is 10-800 mm;

an external width $H_{res\_Rx}$ of the magnetic-resonance receiving antenna is 10-800 mm;

each of a length $L_{res\_Rx1}$ of the first receiving resonant antenna, a length $L_{res\_Rx2}$ of the second receiving resonant antenna, a length $L_{res\_Rx3}$ of the third receiving resonant antenna and a length $L_{res\_Rx4}$ of the fourth receiving resonant antenna is 5-400 mm;

each of a width $H_{res\_Rx1}$ of the first receiving resonant antenna, a width $H_{res\_Rx2}$ of the second receiving resonant antenna, a width $H_{res\_Rx3}$ of the third receiving resonant antenna and a width $H_{res\_Rx4}$ of the fourth receiving resonant antenna is 5-400 mm;

each of a width $W_{res\_Rx1}$ of microstrip lines in the first receiving resonant antenna, a width $W_{res\_Rx2}$ of microstrip lines in the second receiving resonant antenna, a width $W_{res\_Rx3}$ of microstrip lines in the third receiving resonant antenna, a width $W_{res\_Rx4}$ of microstrip lines in the fourth receiving resonant antenna, a width $W_{res\_Rx5}$ of the third microstrip line and a width $W_{res\_Rx6}$ of the fourth microstrip line is 1-6 mm;

each of a distance $S_{res\_Rx1}$ between the microstrip lines in the first receiving resonant antenna, a distance $S_{res\_Rx2}$ between the microstrip lines in the second receiving resonant antenna, a distance $S_{res\_Rx3}$ between the microstrip lines in the third receiving resonant antenna and a distance $S_{res\_Rx4}$ between the microstrip lines in the fourth receiving resonant antenna is 0.5-2 mm; and a receiving resonant capacitance value of the magnetic-resonance receiving antenna is 300 pF.

6. The multi-transmitting multi-receiving magnetic-resonance wireless charging system according to claim 1, wherein, the receiving-antenna matching network comprises a capacitor AAC1, a capacitor AAC2, a capacitor AAC3 and a capacitor AAC4; wherein a first end of the capacitor AAC1 is connected to a first end of the capacitor AAC2, a first end of the capacitor AAC3, a first end of the capacitor AAC4 and a first electromagnetic energy output port Coil of the magnetic-resonance receiving antenna, respectively;

a second end of the capacitor AAC1 is connected to a second end of the capacitor AAC2; a second end of the capacitor AAC3 is connected to a second end of the capacitor AAC4 and a second electromagnetic energy output port Coil of the magnetic-resonance receiving antenna, respectively;

the rectifier and filter module comprises a full-bridge rectifier sub-circuit, an overvoltage protection sub-circuit, an input filter sub-circuit, a rectified voltage collecting sub-circuit, a +5V regulator sub-circuit and a +5V regulator input sub-circuit; wherein, the full-bridge rectifier sub-circuit comprises a diode AAD1, a diode AAD2, a diode AAD3 and a diode AAD4; wherein an anode of the diode AAD1 is connected to a cathode of the diode AAD3 and the second end of the capacitor AAC1, respectively;

a cathode of the diode AAD1 is connected to a cathode of the diode AAD2, a first end of a capacitor AAC27 and a grounded capacitor AAC15, respectively;

an anode of the diode AAD2 is connected to a cathode of the diode AAD4 and the second end of the capacitor AAC4, respectively;

an anode of the diode AAD3 is connected to an anode of the diode AAD4 and a second end of the capacitor AAC27, respectively;

the overvoltage protection sub-circuit comprises a comparator chip AAN1; wherein a non-inverting input terminal of the comparator chip AAN1 is connected to a first end of a resistor AAR5, a cathode terminal of a diode chip AAN2, a reference voltage terminal of the diode chip AAN2 and a grounded capacitor AAC32, respectively;

an inverting input terminal of the comparator chip AAN1 is connected to a first end of a resistor AAR4, a grounded resistor AAR9, a grounded capacitor AAC29 and a grounded capacitor AAC30, respectively;

a voltage terminal of the comparator chip AAN1 is connected to a grounded capacitor AAC31 and a second end of the resistor AAR5, respectively;

a grounded terminal of the comparator chip AAN1 is connected to an anode terminal of the diode chip AAN2 and an emitter of a triode AAQ2, respectively, and the grounded terminal of the comparator chip AAN1, the anode terminal of the diode chip AAN2 and the emitter of the triode AAQ2 are grounded;

an output terminal of the comparator chip AAN1 is connected to a first end of a resistor AAR7 and a cathode of a diode AAD5, respectively; an anode of the diode AAD5 is connected to a first end of a resistor AAR3; a second end of the resistor AAR7 is connected to a base of the triode AAQ2; a collector of the triode AAQ2 is connected to a first end of a resistor AAR1 and a gate of an MOS transistor AAQ1 through a resistor AAR2, respectively; a source of the MOS transistor AAQ1 is connected to a second end of the resistor AAR1 and the cathode of the diode AAD1, respectively;

the input filter sub-circuit comprises a polar capacitor AAC5, a polar capacitor AAC14, a polar capacitor AAC16 and a polar capacitor AAC21; wherein an anode of the polar capacitor AAC5 is connected to an anode of the polar capacitor AAC14, an anode of the polar capacitor AAC16, an anode of the polar capacitor AAC21, grounded capacitors AAC6-AAC13, grounded capacitors AAC17-AAC20, grounded capacitors AAC22-AAC26 and a drain of the MOS transistor AAQ1, respectively;

a cathode of the polar capacitor AAC5, a cathode of the polar capacitor AAC14, a cathode of the polar capacitor AAC16 and a cathode of the polar capacitor AAC21 are grounded;

the rectified voltage collecting sub-circuit comprises a resistor AAR6; wherein a first end of the resistor AAR6 is connected to the source of the MOS transistor AAQ1, a second end of the resistor AAR3 and a second end of the resistor AAR4, respectively;

a second end of the resistor AAR6 is connected to a first end of a resistor AAR8 and a grounded resistor AAR10, respectively;

a second end of the resistor AAR8 is connected to a grounded capacitor AAC28;

the +5V regulator sub-circuit comprises a regulator chip AAN8; wherein a pin Vout of the regulator chip AAN8 is connected to a grounded capacitor AAC60, a grounded capacitor AAC61 and the second end of the resistor AAR5, respectively;

a pin GND of the regulator chip AAN8 is grounded; and the +5V regulator input sub-circuit comprises a comparator chip AAN7; wherein a non-inverting input terminal of the comparator chip AAN7 is connected to a first end of a resistor AAR31, a grounded resistor AAR32 and a grounded capacitor AAC59, respectively;

an inverting input terminal of the comparator chip AAN7 is connected to a reference voltage VREF;

a voltage terminal of the comparator chip AAN7 is connected to the pin Vout of the regulator chip AAN8; a grounded terminal of the comparator chip AAN7 is grounded;

an output terminal of the comparator chip AAN7 is connected to a base of a triode AAQ4, a grounded resistor AAR38 and a grounded capacitor AAC66 through a resistor AAR36, respectively;

an emitter of the triode AAQ4 is grounded; a collector of the triode AAQ4 is connected to a pin Vin of the regulator chip AAN8, grounded capacitors AAC62-AAC65, a grounded resistor AAR37 and a first end of a resistor AAR34 through a resistor AAR35, respectively;

a second end of the resistor AAR34 is connected to a grounded capacitor AAC58, a second end of the resistor AAR31 and the source of the MOS transistor AAQ1, respectively.

7. The multi-transmitting multi-receiving magnetic-resonance wireless charging system according to claim 6, wherein the primary regulator and filter module comprises a primary regulator sub-circuit, a primary regulator-output sampling sub-circuit, a primary regulator output on/off sub-circuit, a primary regulator-output filter sub-circuit, and a primary regulator-output current sampling sub-circuit; wherein, the primary regulator sub-circuit comprises a regulator chip AAN4; wherein a pin Vin of the regulator chip AAN4 is connected to a grounded capacitor AAC37 and the drain of the MOS transistor AAQ1, respectively;

a pin COMP of the regulator chip AAN4 is connected to a grounded capacitor AAC47 and a first end of a resistor AAR20, respectively;

a pin RT/CLK of the regulator chip AAN4 is connected to a grounded resistor AAR22;

a pin GND of the regulator chip AAN4 is grounded;

a pin FB of the regulator chip AAN4 is connected to a grounded resistor AAR23 and a first end of a resistor AAR17, respectively;

a pin SW of the regulator chip AAN4 is connected to a cathode of a diode AAD6, a first end of an inductor AAL1 and a first end of a capacitor AAC38, respectively;

a pin BOOT of the regulator chip AAN4 is connected to a second end of the capacitor AAC38; a second end of the resistor AAR20 is connected to a grounded capacitor AAC50; a second end of the inductor AAL1 is connected to a second end of the resistor AAR17;

the primary regulator-output sampling sub-circuit comprises a resistor AAR16; a first end of the resistor AAR16 is connected to the second end of the inductor AAL1; a second end of the resistor AAR16 is connected to a grounded resistor AAR11 and a first end of a resistor AAR13, respectively; a second end of the resistor AAR13 is connected to a grounded capacitor AAC33;

the primary regulator output on/off sub-circuit comprises a triode chip AAN3; wherein a $1^{st}$ pin of the triode chip AAN3 is connected to a $2^{nd}$ pin of the triode chip AAN3, a $3^{rd}$ pin of the triode chip AAN3, a first end of a resistor AAR15 and the second end of the inductor AAL1, respectively;

a $4^{th}$ pin of the triode chip AAN3 is connected to a second end of the resistor AAR15 and a first end of the resistor AAR14, respectively;

a $5^{th}$ pin of the triode chip AAN3 is connected to a $6^{th}$ pin, a $7^{th}$ pin and an $8^{th}$ pin of the triode chip AAN3, respectively; a second end of the resistor AAR14 is connected to a collector of a triode AAQ3; an emitter of the triode AAQ3 is grounded; a base of the triode AAQ3 is connected to a first end of a resistor AAR12;

the primary regulator-output filter sub-circuit comprises grounded capacitors AAC34-AAC36 and grounded capacitors AAC39-AAC45; the grounded capacitors AAC34-AAC36 and the grounded capacitors AAC39-

AAC41 are connected to the 8th pin of the triode chip AAN3; the grounded capacitors AAC42-AAC45 are connected to the 1st pin of the triode chip AAN3; and the primary regulator-output current sampling sub-circuit comprises an operational amplifier chip AAN5; wherein a non-inverting input terminal of the operational amplifier chip AAN5 is connected to a first end of an inductor AAL2, a grounded capacitor AAC48 and a grounded capacitor AAC49 through a resistor AAR19, respectively;

an inverting input terminal of the operational amplifier chip AAN5 is connected to a first end of a resistor AAR24, a first end of a capacitor AAC51 and a grounded resistor AAR26, respectively;

a voltage terminal of the operational amplifier chip AAN5 is connected to a grounded capacitor AAC52 and the pin Vout of the regulator chip AAN8, respectively;

a grounded terminal of the operational amplifier chip AAN5 is grounded;

an output terminal of the operational amplifier chip AAN5 is connected to a second end of the resistor AAR24, a second end of the capacitor AAC51 and a first end of a resistor AAR21, respectively; a second end of the inductor AAL2 is connected to a grounded resistor AAR27 and a grounded capacitor AAC46, respectively.

8. The multi-transmitting multi-receiving magnetic-resonance wireless charging system according to claim 7, wherein the secondary regulator and filter module comprises a secondary regulator sub-circuit and a secondary output filter sub-circuit; wherein, the secondary regulator sub-circuit comprises a regulator chip AAN6; wherein a pin Vin of the regulator chip AAN6 is connected to a grounded capacitor AAC54 and the 8th pin of the triode chip AAN3, respectively;

a pin RT/CLK of the regulator chip AAN6 is connected to a grounded resistor AAR30; a pin GND of the regulator chip AAN6 is grounded;

a pin FB of the regulator chip AAN6 is connected to a first end of a resistor AAR28 and a grounded resistor AAR29, respectively;

a pin SW of the regulator chip AAN6 is connected to a first end of an inductor AAL3, a first end of a capacitor AAC53 and a cathode of a diode AAD7, respectively;

a pin BOOT of the regulator chip AAN6 is connected to a second end of the capacitor AAC53; an anode of the diode AAD7 is grounded; a second end of the inductor AAL3 is connected to a second end of the resistor AAR28;

the secondary output filter sub-circuit comprises grounded capacitors AAC55-AAC57, and the grounded capacitors AAC55-AAC57 are connected to the second end of the inductor AAL3.

9. The multi-transmitting multi-receiving magnetic-resonance wireless charging system according to claim 8, wherein the power synthesis and protocol module comprises a power synthesis sub-circuit, a synthesis voltage detecting sub-circuit, a TYPE-C female interface sub-circuit, a protocol sub-circuit, an apparatus detecting sub-circuit, a synthesis output filter sub-circuit, and a synthesis output current sampling sub-circuit; wherein, the power synthesis sub-circuit comprises a diode TAD2; wherein an anode of the diode TAD2 is connected to the second end of the inductor AAL3;

a cathode of the diode TAD2 is connected to a grounded capacitor TC2 and a grounded capacitor TC3, respectively;

the synthesis voltage detecting sub-circuit comprises a diode TAD1; wherein a cathode of the diode TAD1 is connected to the cathode of the diode TAD2, and an anode of the diode TAD1 is connected to a first end of a resistor TR2;

a second end of the resistor TR2 is connected to a first end of a resistor TR1, a first end of a resistor TR3 and a first end of a capacitor TC1, respectively, and the second end of the resistor TR2, the first end of the resistor TR1, the first end of the resistor TR3 and the first end of the capacitor TC1 are grounded;

a second end of the resistor TR1 is connected to a first end of a resistor TR4 and a first end of a resistor TR5, respectively;

a second end of the capacitor TC1 is connected to a second end of the resistor TR4;

a second end of the resistor TR3 is connected to a cathode of a red-light diode;

an anode of the red-light diode is connected to a second end of the resistor TR5 and the cathode of the diode TAD2, respectively;

the TYPE-C female interface sub-circuit comprises a USB interface chip USB1; wherein a 1st pin of the USB interface chip USB1 is connected to a 12th pin of the USB interface chip USB1, and the 1st pin of the USB interface chip USB1 and the 12th pin of the USB interface chip USB1 are grounded;

a 2nd pin of the USB interface chip USB1 is connected to an 11th pin of the USB interface chip USB1;

a 5th pin of the USB interface chip USB1 is connected to a 7th pin of the USB interface chip USB1;

a 6th pin of the USB interface chip USB1 is connected to an 8th pin of the USB interface chip USB1;

the protocol sub-circuit comprises a protocol chip TN3; wherein a pin V5V of the protocol chip TN3 is connected to a grounded capacitor TC8;

a pin AGND and a pin PGND of the protocol chip TN3 are grounded;

a pin V18V of the protocol chip TN3 is connected to a grounded capacitor TC10;

a pin CC2 of the protocol chip TN3 is connected to a 10th pin of the USB interface chip USB1;

a pin CC1 of the protocol chip TN3 is connected to a 4th pin of the USB interface chip USB1;

a pin DN of the protocol chip TN3 is connected to the 6th pin of the USB interface chip USB1;

a pin DP of the protocol chip TN3 is connected to the 5th pin of the USB interface chip USB1;

a pin VBUS of the protocol chip TN3 is connected to the 2nd pin of the USB interface chip USB1;

a pin PWR-ENB of the protocol chip TN3 is connected to a first end of a resistor TR12;

a pin VFB of the protocol chip TN3 is connected to a first end of a capacitor TC7, a first end of a resistor TR10, a grounded resistor TR15 and a grounded capacitor TC6, respectively;

a pin VFBOUT of the protocol chip TN3 is connected to a first end of a resistor TR11, a first end of a resistor TR14 and a 2nd pin of an optical coupling chip TN2, respectively;

a pin VIN-PS of the protocol chip TN3 is connected to a second end of the resistor TR10, a second end of the resistor TR11, a first end of a resistor TR6, a first end of a resistor TR7, a first end of a resistor TR8 and a 1st pin, a 2nd pin and a 3rd pin of a switching chip TN1, respectively;

a pin ISENP of the protocol chip TN3 is connected to a second end of the resistor TR6 and the cathode of the diode TAD2, respectively; a second end of the resistor TR14 is connected to a second end of the capacitor TC7;

a 1st pin of the optical coupling chip TN2 is connected to a second end of the resistor TR8;

a 3rd pin of the optical coupling chip TN2 is grounded;

a 4th pin of the optical coupling chip TN2 is connected to a grounded capacitor TC4 and a pin COMP of the regulator chip AAN6, respectively;

a 4th pin of the switching chip TN1 is connected to a second end of the resistor TR7 and a second end of the resistor TR12, respectively;

a 5th pin, a 6th pin, a 7th pin and an 8th pin of the switching chip TN1 are connected to the 2nd pin of the USB interface chip USB1;

the apparatus detecting sub-circuit comprises a triode TQ1; wherein a base of the triode TQ1 is connected to a first end of a resistor TR9, a grounded resistor TR13 and a grounded capacitor TC5, respectively;

an emitter of the triode TQ1 is grounded; a second end of the resistor TR9 is connected to the 4th pin of the switching chip TN1;

the synthesis output filter sub-circuit comprises capacitors TC11-TC16; wherein a first end of each of the capacitors TC11-TC16 is connected to the 2nd pin of the USB interface chip USB1;

a second end of each of the capacitors TC11-TC16 is connected to the 1st pin of the USB interface chip USB1, and is grounded; and the synthesis output current sampling sub-circuit comprises a current sampling chip TN4; wherein a pin OUTA of the current sampling chip TN4 is connected to a first end of a resistor TR16;

a pin INA− of the current sampling chip TN4 is connected to a second end of the resistor TR16 and a grounded resistor TR17, respectively;

a pin INA+ of the current sampling chip TN4 is connected to a first end of a resistor TR18; a pin VSS of the current sampling chip TN4 is grounded;

a pin INB+ of the current sampling chip TN4 is connected to a grounded capacitor TC17, a grounded capacitor TC18 and a first end of a resistor TR19, respectively;

a pin INB− and a pin OUTB of the current sampling chip TN4 are connected to a second end of the resistor TR18;

a pin VCC of the current sampling chip TN4 is connected to a grounded capacitor TC9 and the pin Vout of the regulator chip AAN8, respectively; a second end of the resistor TR19 is connected to a grounded capacitor TC19, a grounded capacitor TC20 and a first end of a resistor TR20, respectively; a second end of the resistor TR20 is connected to the 1st pin of the USB interface chip USB1.

10. The multi-transmitting multi-receiving magnetic-resonance wireless charging system according to claim 9, wherein, the receiving-end Bluetooth-communication and control module comprises a Bluetooth module sub-circuit and a Bluetooth power supply sub-circuit; wherein, the Bluetooth module sub-circuit comprises a single chip microcomputer chip QN4; wherein a pin DVDD1 of the single chip microcomputer chip QN4 is connected to a pin DVDD2 of the single chip microcomputer chip QN4, pins AVDD1-AVDD6 of the single chip microcomputer chip QN4, grounded capacitors TC21-TC27, a first end of an inductor TL1 and a 3.3V power source, respectively;

a pin GND of the single chip microcomputer chip QN4 is grounded;

a pin NC of the single chip microcomputer chip QN4 is connected to the 3.3V power source;

a pin P2_0 of the single chip microcomputer chip QN4 is connected to a 1st pin of a connector P1; a 2nd pin of the connector P1 is grounded;

a pin P2_1 of the single chip microcomputer chip QN4 is connected to a 4th pin of a connector P2;

a pin P2_2 of the single chip microcomputer chip QN4 is connected to a 3rd pin of the connector P2; a 2nd pin of the connector P2 is grounded; a 1st pin of the connector P2 is connected to the 3.3V power source;

a pin P1_0 of the single chip microcomputer chip QN4 is connected to a cathode of a light-emitting diode TLED 1; an anode of the light-emitting diode TLED 1 is connected to the 3.3V power source through a resistor TR23;

a pin P1_2 of the single chip microcomputer chip QN4 is connected to a collector of the triode TQ1;

a pin P1_4 of the single chip microcomputer chip QN4 is connected to a second end of the resistor AAR12;

a pin P1_6 of the single chip microcomputer chip QN4 is connected to a 3rd pin of a connector P3;

a pin P1_7 of the single chip microcomputer chip QN4 is connected to a 2nd pin of the connector P3; a 1st pin of the connector P3 is grounded;

a pin P0_0 of the single chip microcomputer chip QN4 is connected to the second end of the resistor AAR13;

a pin P0_1 of the single chip microcomputer chip QN4 is connected to the pin OUTA of the current sampling chip TN4;

a pin P0_2 of the single chip microcomputer chip QN4 is connected to the second end of the capacitor TC1;

a pin P0_6 of the single chip microcomputer chip QN4 is connected to a second end of the resistor AAR21;

a pin P0_7 of the single chip microcomputer chip QN4 is connected to the second end of the resistor AAR8;

a pin RESET_N of the single chip microcomputer chip QN4 is connected to a 5th pin of the connector P2;

a pin 41 of the single chip microcomputer chip QN4 is grounded;

a pin R_BIAS of the single chip microcomputer chip QN4 is connected to a grounded resistor TR24;

a pin DCOUPL of the single chip microcomputer chip QN4 is connected to a grounded capacitor TC39;

a pin XOSC_Q2 of the single chip microcomputer chip QN4 is connected to a grounded capacitor TC37 and a 1st pin of a connector TY1, respectively;

a pin XOSC_Q1 of the single chip microcomputer chip QN4 is connected to a grounded capacitor TC38 and a 3rd pin of the connector TY1, respectively; a 2nd pin and a 4th pin of the connector TY1 are grounded;

a pin RF_N of the single chip microcomputer chip QN4 is connected to a first end of a capacitor TC35 and a grounded inductor TL5 through a capacitor TC36, respectively;

a pin RF_P of the single chip microcomputer chip QN4 is connected to a first end of an inductor TL4 and a grounded capacitor QC1 through a capacitor TC33, respectively; the second end of the capacitor TC35 is connected to a second end of the inductor TL4 and a first end of an inductor TL2, respectively; a second end of the inductor TL2 is connected to a first end of an inductor TL3 and a grounded capacitor TC34, respectively; a second end of the inductor TL3 is connected to the antenna PCBANT; and the Bluetooth power supply sub-circuit comprises a regulator chip TN5; wherein a pin Vout of the regulator chip TN5 is connected to a grounded capacitor TC29, a grounded capacitor TC30 and a second end of the inductor TL1, respectively;

a pin Vin of the regulator chip TN5 is connected to a grounded capacitor TC28, a grounded capacitor TC31 and a first end of a resistor TR21, respectively; a second end of the resistor TR21 is connected to the pin Vout of the regulator chip AAN8;

a pin GND of the regulator chip TN5 is connected to a first end of a resistor TR22, and the pin GND of the regulator chip TN5 and the first end of the resistor TR22 are grounded; a second end of the resistor TR22 is connected to the second end of the inductor AAL2.

* * * * *